US008289527B2

(12) United States Patent
Li et al.

(10) Patent No.: US 8,289,527 B2
(45) Date of Patent: Oct. 16, 2012

(54) OPTIMIZATION OF RAY TRACING AND BEAM PROPAGATION PARAMETERS

(75) Inventors: Shifang Li, Pleasanton, CA (US); Manuel Madriaga, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 432 days.

(21) Appl. No.: 12/752,637

(22) Filed: Apr. 1, 2010

(65) Prior Publication Data
US 2011/0246142 A1 Oct. 6, 2011

(51) Int. Cl.
*G01B 11/24* (2006.01)
*G01J 4/00* (2006.01)
(52) U.S. Cl. .......... 356/601; 356/364
(58) Field of Classification Search ........ 356/364, 356/601, 606, 607, 625
See application file for complete search history.

(56) References Cited

U.S. PATENT DOCUMENTS

| 6,785,638 | B2 | 8/2004 | Niu et al. |
| 6,891,626 | B2 | 5/2005 | Niu et al. |
| 6,943,900 | B2 | 9/2005 | Jakatdar et al. |
| 7,064,829 | B2 | 6/2006 | Li et al. |
| 7,271,902 | B2 | 9/2007 | Li et al. |
| 7,280,229 | B2 | 10/2007 | Li et al. |
| 7,302,367 | B2 | 11/2007 | Li et al. |
| 7,388,677 | B2 | 6/2008 | Vuong et al. |
| 7,450,232 | B2 | 11/2008 | Li et al. |
| 7,477,405 | B2 * | 1/2009 | Finarov et al. .......... 356/625 |
| 7,617,075 | B2 | 11/2009 | Li et al. |
| 7,660,696 | B1 * | 2/2010 | Norton et al. .......... 702/151 |
| 2004/0109173 | A1 * | 6/2004 | Finarov et al. .......... 356/625 |
| 2005/0192914 | A1 | 9/2005 | Drege et al. |
| 2010/0007885 | A1 | 1/2010 | Li et al. |
| 2010/0010765 | A1 | 1/2010 | Li et al. |
| 2011/0245955 | A1 * | 10/2011 | Li et al. .......... 700/104 |
| 2011/0246400 | A1 * | 10/2011 | Li .......... 706/12 |

OTHER PUBLICATIONS

U.S. Appl. No. 12/752,080, filed Mar. 31, 2010 for Li, et al.
U.S. Appl. No. 12/752,111, filed Mar. 31, 2010 for Li, et al.
U.S. Appl. No. 12/752,916, filed Apr. 1, 2010 for Li, et al.
U.S. Appl. No. 12/050,053, filed Mar. 17, 2008 for Tian, et al.

* cited by examiner

*Primary Examiner* — Roy M Punnoose
(74) *Attorney, Agent, or Firm* — Manuel B. Madriaga

(57) ABSTRACT

Provided is a method for determining profile parameters of a sample structure on a workpiece using an optical metrology system optimized to achieve one or more accuracy targets, the optical metrology system including an optical metrology tool, an optical metrology tool model, a profile model of the sample structure, and a parameter extraction algorithm, the method comprising: setting one or more accuracy targets for profile parameter determination for the sample structure; selecting a number of rays and beam propagation parameters to be used to model the optical metrology tool, measuring a diffraction signal off the sample structure using the optical metrology tool, generating a metrology output signal, determining an adjusted metrology output signal using the metrology output signal and calibration data, concurrently optimizing the optical metrology tool model and the profile model using the adjusted metrology output signal and the parameter extraction algorithm.

19 Claims, 15 Drawing Sheets

OPTIMIZATION OF RAY TRACING AND BEAM PROPAGATION PARAMETERS

BACKGROUND

1. Field

The present application generally relates to the use of an optical metrology system to measure a structure formed on a workpiece, and, more particularly, to a method for enhancing the accuracy of a metrology output signal obtained from an optical metrology tool by optimizing the geometric optics and beam propagation parameters in conjunction with structure profile optimization.

2. Related Art

Optical metrology involves directing an incident beam at a structure on a workpiece, measuring the resulting diffraction signal, and analyzing the measured diffraction signal to determine various characteristics of the structure. The workpiece can be a wafer, a substrate, photomask or a magnetic medium. In manufacturing of the workpieces, periodic gratings are typically used for quality assurance. For example, one typical use of periodic gratings includes fabricating a periodic grating in proximity to the operating structure of a semiconductor chip. The periodic grating is then illuminated with an electromagnetic radiation. The electromagnetic radiation that deflects off of the periodic grating are collected as a diffraction signal. The diffraction signal is then analyzed to determine whether the periodic grating, and by extension whether the operating structure of the semiconductor chip, has been fabricated according to specifications.

In one conventional system, the diffraction signal collected from illuminating the periodic grating (the measured diffraction signal) is compared to a library of simulated diffraction signals. Each simulated diffraction signal in the library is associated with a hypothetical profile. When a match is made between the measured diffraction signal and one of the simulated diffraction signals in the library, the hypothetical profile associated with the simulated diffraction signal is presumed to represent the actual profile of the periodic grating. The hypothetical profiles, which are used to generate the simulated diffraction signals, are generated based on a profile model that characterizes the structure to be examined. Thus, in order to accurately determine the profile of the structure using optical metrology, a profile model that accurately characterizes the structure should be used.

With increased requirement for throughput, decreasing size of the test structures, smaller spot sizes, and lower cost of ownership, there is greater need to optimize design of optical metrology systems to meet the objectives of the overall application. Current optical metrology systems typically focus on optimizing the variables used in generating the simulated diffraction signals. Accuracy requirements increase as the dimensions of the structures get smaller, for example, as the lithography node goes to 30 nm and smaller. In terms of measurement uncertainty, as the size of the structures get smaller, complicated interactions between the optical metrology tool properties vary in complex ways to affect the accuracy of the measurement. For example, as the lithography node gets smaller, errors associated with critical dimension and structure profile extraction were the larger errors to be considered. With a smaller lithography node, the total measurement uncertainty and other characterization of uncertainty need to be considered with all elements that can contribute to the error in the measured signal off the structure. As the size of the structures get smaller, factors that did not substantially affect the measurement accuracy are now making an impact.

Furthermore, assumptions used in modeling the optical metrology tool are no longer sufficient. In order to achieve enhanced accuracy of profile parameters of the structure, considerations regarding the physical optics, geometric optics, beam propagation parameters, and detail analysis of the effect of imperfections of optical elements on the illumination and diffraction beam paths need to be incorporated in the modeling and simulations of the diffraction signal to be used in a profile parameter extraction system.

SUMMARY

Provided is method for determining profile parameters of a sample structure on a workpiece using an optical metrology system optimized to achieve one or more accuracy targets, the optical metrology system including an optical metrology tool, an optical metrology tool model, a profile model of the sample structure, and a parameter extraction algorithm, the method comprising: setting one or more accuracy targets for profile parameter determination for the sample structure; selecting a number of rays and beam propagation parameters to be used to model the optical metrology tool, measuring a diffraction signal off the sample structure using the optical metrology tool, generating a metrology output signal, determining an adjusted metrology output signal using the metrology output signal and calibration data, concurrently optimizing the optical metrology tool model and the profile model using the adjusted metrology output signal and the parameter extraction algorithm.

BRIEF DESCRIPTION OF DRAWINGS

FIGS. 9A1 and 9A2 depict architectural diagrams illustrating the polarization changes as a ray is transmitted through a refractive optical element whereas

DETAILED DESCRIPTION

In order to facilitate the description of the present invention, a semiconductor wafer or substrate may be utilized to illustrate an application of the concept. The systems and processes equally apply to other workpieces that have repeating structures. The workpiece may be a wafer or substrate, a substrate, disk, or the like. Furthermore, in this application, the term structure when it is not qualified refers to a patterned structure.

Figure 1:
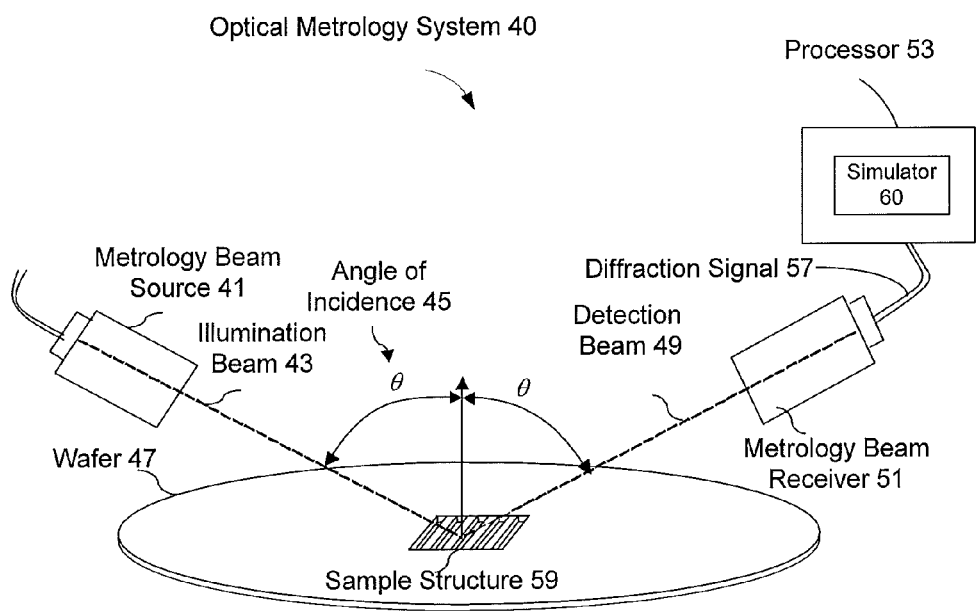
FIG. 1 is an architectural diagram illustrating an exemplary embodiment where an optical metrology system can be utilized to determine the profiles of structures formed on a semiconductor wafer or substrate.

FIG. 1 is an architectural diagram illustrating an exemplary embodiment where optical metrology can be utilized to determine the profiles or shapes of structures fabricated on a semiconductor wafer or substrate. The optical metrology system 40 includes a metrology beam source 41 projecting a metrology illumination beam 43 at the sample structure 59 of a wafer or substrate 47. The metrology illumination beam 43 is projected at an incidence angle 45 (θ) towards the sample structure 59. The diffracted detection beam 49 is measured by a metrology beam receiver 51. A measured diffraction signal 57 is transmitted to a processor 53. The processor 53 compares the measured diffraction signal 57 against a simulator 60 of simulated diffraction signals and associated hypothetical profiles representing varying combinations of critical dimensions of the sample structure and resolution. The simulator can be either a library that consists of a machine learning system, pre-generated data base and the like (a library system), or on demand diffraction signal generator that solves the Maxwell equation for a giving profile (a regression system). In one exemplary embodiment, the diffraction signal generated by the simulator 60 best matching the measured diffraction signal 57 is selected. The hypothetical profile and associated critical dimensions of the selected simulator 60 are assumed to correspond to the actual cross-sectional shape and critical dimensions of the features of the sample structure 59. The optical metrology system 40 may utilize a reflectometer, an ellipsometer, or other optical metrology device to measure the diffraction beam or signal. An optical metrology system is described in U.S. Pat. No. 6,943,900, entitled GENERATION OF A LIBRARY OF PERIODIC GRATING DIFFRACTION SIGNAL, issued on Sep. 13, 2005, which is incorporated herein by reference in its entirety.

Simulated diffraction signals can be generated by applying Maxwell's equations and using a numerical analysis technique to solve Maxwell's equations. It should be noted that various numerical analysis techniques, including variations of RCWA, can be used. For a more detail description of RCWA, see U.S. Pat. No. 6,891,626, titled CACHING OF INTRA-LAYER CALCULATIONS FOR RAPID RIGOROUS COUPLED-WAVE ANALYSES, filed on Jan. 25, 2001, issued May 10, 2005, which is incorporated herein by reference in its entirety.

Simulated diffraction signals can also be generated using a machine learning system (MLS). Prior to generating the simulated diffraction signals, the MLS is trained using known input and output data. In one exemplary embodiment, simulated diffraction signals can be generated using an MLS employing a machine learning algorithm, such as back-propagation, radial basis function, support vector, kernel regression, and the like. For a more detailed description of machine learning systems and algorithms, see U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

Figure 2:
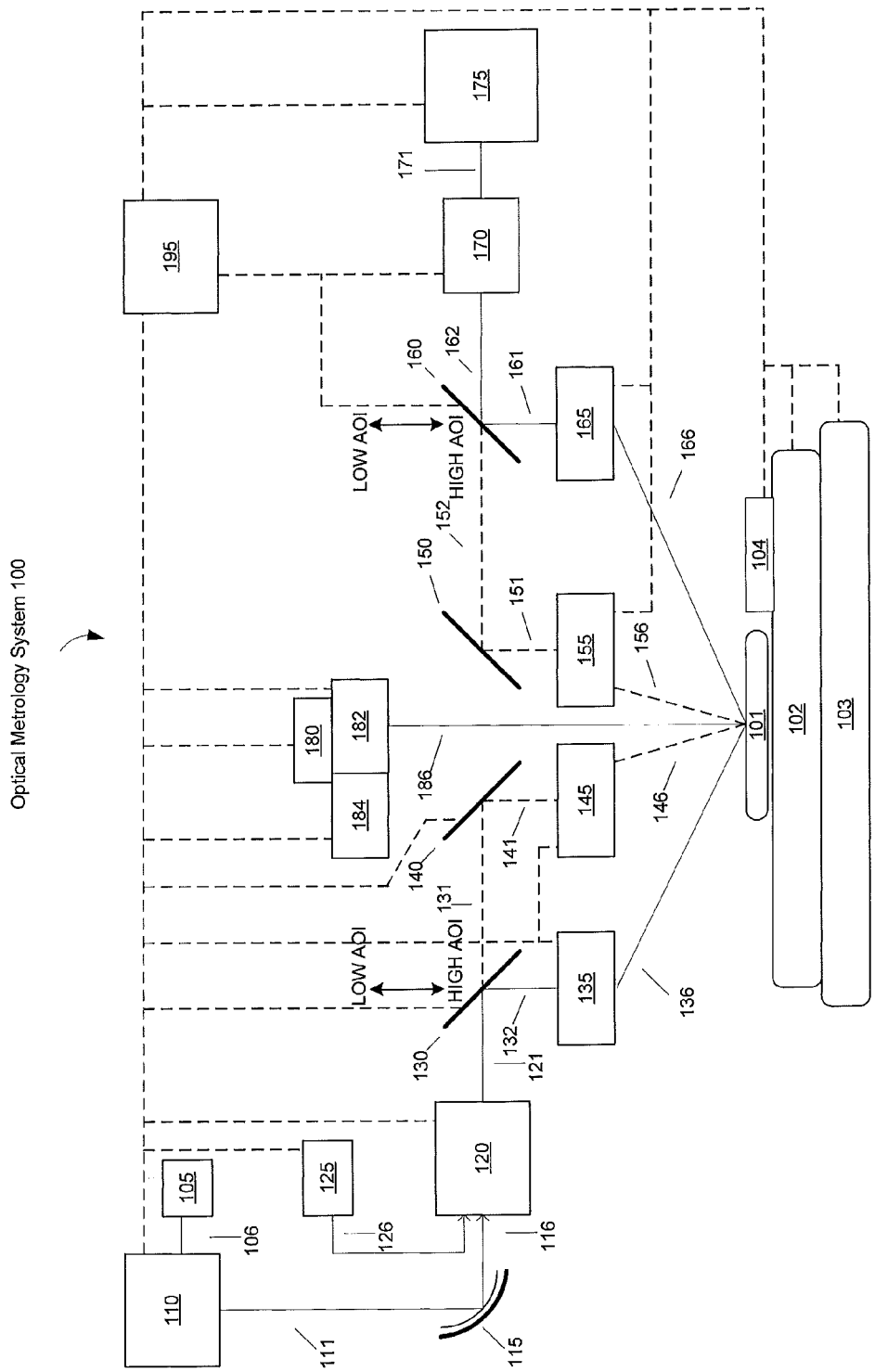
FIG. 2 depicts an exemplary optical metrology system in accordance with embodiments of the invention.

FIG. 2 shows an exemplary block diagram of an optical metrology system in accordance with embodiments of the invention. In the illustrated embodiment, an optical metrology system 100 can comprise a lamp subsystem 105, and at least two optical outputs 106 from the lamp subsystem can be transmitted to an illuminator subsystem 110. At least two optical outputs 111 from the illuminator subsystem 110 can be transmitted to a selector subsystem 115. The selector subsystem 115 can send at least two signals 116 to a beam generator subsystem 120. In addition, a reference subsystem 125 can be used to provide at least two reference outputs 126 to the beam generator subsystem 120. The wafer 101 is positioned using an X-Y-Z-theta stage 102 where the wafer 101 is adjacent to a wafer alignment sensor 104, supported by a platform base 103.

The optical metrology system 100 can comprise a first selectable reflection subsystem 130 that can be used to direct at least two outputs 121 from the beam generator subsystem 120 on a first path 131 when operating in a first mode "LOW AOI" (AOI, Angle of Incidence) or on a second path 132 when operating in a second mode "HIGH AOI". When the first selectable reflection subsystem 130 is operating in the first mode "LOW AOI", at least two of the outputs 121 from the beam generator subsystem 120 can be directed to a first reflection subsystem 140 as outputs on the first path 131, and at least two outputs 141 from the first reflection subsystem can be directed to a high angle focusing subsystem 145. When the first selectable reflection subsystem 130 is operating in the second mode "HIGH AOI", at least two of the outputs 121 from the beam generator subsystem 120 can be directed to a low angle focusing subsystem 135 as outputs on the second path 132. Alternatively, other modes in addition to "LOW AOI" and "HIGH AOI" may be used and other configurations may be used.

When the metrology system 100 is operating in the first mode "LOW AOI", at least two of the outputs 146 from the high angle focusing subsystem 145 can be directed to the wafer 101. For example, a high angle of incidence can be used. When the metrology system 100 is operating in the second mode "HIGH AOI", at least two of the outputs 136 from the low angle focusing subsystem 135 can be directed to the wafer 101. For example, a low angle of incidence can be used. Alternatively, other modes may be used and other configurations may be used.

The optical metrology system 100 can comprise a high angle collection subsystem 155, a low angle collection subsystem 165, a second reflection subsystem 150, and a second selectable reflection subsystem 160.

When the metrology system 100 is operating in the first mode "LOW AOI", at least two of the outputs 156 from the wafer 101 can be directed to the high angle collection subsystem 155. For example, a high angle of incidence can be used. In addition, the high angle collection subsystem 155 can process the outputs 156 obtained from the wafer 101 and high angle collection subsystem 155 can provide outputs 151 to the second reflection subsystem 150, and the second reflection subsystem 150 can provide outputs 152 to the second selectable reflection subsystem 160. When the second selectable reflection subsystem 160 is operating in the first mode "LOW AOI" the outputs 152 from the second reflection subsystem 150 can be directed to the analyzer subsystem 170. For example, at least two blocking elements can be moved allowing the outputs 152 from the second reflection subsystem 150 to pass through the second selectable reflection subsystem 160 with a minimum amount of loss.

When the metrology system 100 is operating in the second mode "HIGH AOI", at least two of the outputs 166 from the wafer 101 can be directed to the low angle collection subsystem 165. For example, a low angle of incidence can be used. In addition, the low angle collection subsystem 165 can process the outputs 166 obtained from the wafer 101 and low angle collection subsystem 165 can provide outputs 161 to the second selectable reflection subsystem 160. When the second selectable reflection subsystem 160 is operating in the second mode "HIGH AOI" the outputs 162 from the second selectable reflection subsystem 160 can be directed to the analyzer subsystem 170.

When the metrology system 100 is operating in the first mode "LOW AOI", high incident angle data from the wafer 101 can be analyzed using the analyzer subsystem 170, and when the metrology system 100 is operating in the second mode "HIGH AOI", low incident angle data from the wafer 101 can be analyzed using the analyzer subsystem 170.

Metrology system 100 can include at least two measurement subsystems 175. At least two of the measurement subsystems 175 can include at least two detectors such as spectrometers. For example, the spectrometers can operate from the Deep-Ultra-Violet to the visible regions of the spectrum.

The metrology system 100 can include at least two camera subsystems 180, at least two illumination and imaging subsystems 182 coupled to at least two of the camera subsystems 180. In addition, the metrology system 100 can also include at least two illuminator subsystems 184 that can be coupled to at least two of the imaging subsystems 182. (describe output 186)

In some embodiments, the metrology system 100 can include at least two auto-focusing subsystems 190. Alternatively, other focusing techniques may be used. At least two of the controllers (not shown) in at least two of the subsystems (105, 110, 115, 120, 125, 130, 135, 140, 145, 150, 155, 160, 165, 170, 175, 180, 182, and 195) can be used when performing measurements of the structures. A controller can receive real-signal data to update subsystem, processing element, process, recipe, profile, image, pattern, and/or model data. At least two of the subsystems (105, 110, 115, 120, 125, 130, 135, 140, 145, 150, 155, 160, 165, 170, 175, 180, 182, and 190) can exchange data using at least two Semiconductor Equipment Communications Standard (SECS) messages, can read and/or remove information, can feed forward, and/or can feedback the information, and/or can send information as a SECS message.

Those skilled in the art will recognize that at least two of the subsystems (105, 110, 115, 120, 125, 130, 135, 140, 145, 150, 155, 160, 165, 170, 175, 180, 182, and 195) can include computers and memory components (not shown) as required. For example, the memory components (not shown) can be used for storing information and instructions to be executed by computers (not shown) and may be used for storing temporary variables or other intermediate information during the execution of instructions by the various computers/processors in the metrology system 100. At least two of the subsystems (105, 110, 115, 120, 125, 130, 135, 140, 145, 150, 155, 160, 165, 170, 175, 180, 185, and 190 and 195?) can include the means for reading data and/or instructions from a computer readable medium and can comprise the means for writing data and/or instructions to a computer readable medium. The metrology system 100 can perform a portion of or all of the processing steps of the invention in response to the computers/processors in the processing system executing at least two sequences of at least two instructions contained in a memory and/or received in a message. Such instructions may be received from another computer, a computer readable medium, or a network connection. In addition, at least two of the subsystems (105, 110, 115, 120, 125, 130, 135, 140, 145, 150, 155, 160, 165, 170, 175, 180, 182, and 190 and 195?) can comprise control applications, Graphical User Interface (GUI) components, and/or database components.

It should be noted that the beam when the metrology system 100 is operating in the first mode "LOW AOI" with a high incident angle data from the wafer 101 all the way to the measurement subsystems 175, (output 166, 161, 162, and 171) and when the metrology system 100 is operating in the second mode "HIGH AOI" with a low incident angle data from the wafer 101 all the way to the measurement subsystems 175, (output 156, 151, 152, 162, and 171) is referred to as diffraction signal(s).

Figure 3:
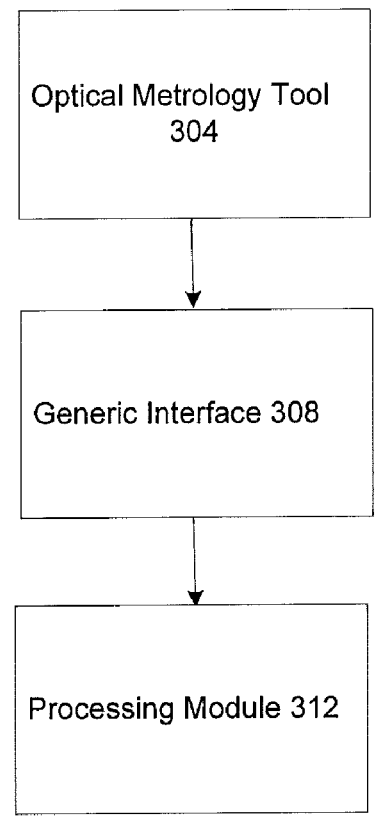
FIG. 3 depicts a prior art optical metrology system flowchart for a generic interface disposed between an optical metrology tool and a processing module.

FIG. 3 depicts a prior art architectural diagram of an optical metrology system for a generic interface disposed between an optical metrology tool such as a photometric device and a processing module. Optical metrology tool 304 includes a light source configured to generate and direct light onto a structure, and a detector configured to detect light diffracted from the structure and to convert the detected light into a measured diffraction signal. The processing module 312 is configured to receive the measured diffraction signal from optical metrology tool 304, and more particularly the detector, to analyze the structure, such as determining the profile of the structure.

Various types of photometric devices can be used, which provide measured diffraction signals using various signal parameters. A generic interface 308 is configured to provide the measured signal to processing module 312 using a standard set of signal parameters. The standard set of signal parameters includes a reflectance parameter that characterizes the change in intensity of light when reflected on the structure, and polarization parameters that characterizes the change in polarization states of light when reflected on the structure. When an optical metrology tool 304 is a reflectometer that only measures the change in the intensity of light, such as a spectrometric reflectometer, generic interface 308 provides the measured diffraction signal to processing module 312 using only the reflectance parameter of the standard set of signal parameters. When optical metrology tool 304 is an ellipsometer that measures both the change in the intensity of light and polarization states of light, such as a rotating compensator ellipsometer (RCE), generic interface 308 provides the measured diffraction signal to processing module 312 using the reflectance parameter and the polarization parameter of the standard set of signal parameters.

The reflectance parameter (R) of the standard set of signal parameters corresponds to an average of the square of the absolute value of the complex reflection coefficients of the light. The polarization parameter includes a first parameter (N) that characterizes half of the difference between s- and p-polarized light of the square of the absolute value of the complex reflection coefficients normalized to R, a second parameter (S) that characterizes the imaginary component of the interference of the two complex reflection coefficients for s- and p-polarized light normalized to R, and a third parameter (C) that characterizes the real component of the interference of the two complex reflection coefficients normalized to R. Thus, the standard set of signal parameters includes the parameters (R, NSC).

Four independent signal parameters are typically used to characterize the measured diffraction signals from photometric devices in practice. The four independent Stokes parameters ($S_0$ $S_1$ $S_2$ $S_3$) are commonly used to characterize the polarization states and intensity of light in optical instrument. Alternatively, a coherency matrix can be used for the same purpose with the Jones matrix formula. The Stokes parameters are related to the coherency matrix by the following relationship:

$$(S_0 S_1 S_2 S_3) = (J_{xx} + J_{yy}, J_{xx} - J_{yy}, J_{xy} + J_{yx}, i(J_{yy} - J_{xy})). \quad (1)$$

For a simple ellipsometer, an ellipsometry parameter $\rho = \tan \Psi e^{i\Delta}$ is often used. In this case, the relationship of the Stokes parameters ($S_0$ $S_1$ $S_2$ $S_3$) to the commonly used ellipsometry parameters $\rho = \tan \Psi e^{i\Delta}$ can be expressed as:

$$(S_0 S_1 S_2 S_3) = I_0 R(1 - \cos 2\psi \sin 2\psi \cos \Delta \sin 2\psi \sin \Delta) \quad (2)$$

where:

$$\rho = \tan \psi e^{i\Delta} = \frac{R_p}{R_s} = \frac{E_{p0}}{E_{s0}}. \text{ (define these terms?)} \quad (3)$$

The ellipsometer parameters ($\rho = \tan \psi e^{i\Delta}$) can be generalized using three parameters (NSC) to characterize complicated effects. In the simplest case, when there is no depolarization, this relationship can be expressed as:

$$(NSC) = (\cos 2\psi \sin 2\psi \sin \Delta \sin 2\psi \cos \Delta) \quad (4)$$

$$\text{and } \sqrt{N^2 + S^2 + C^2} \equiv \beta = 1. \quad (5)$$

Photometric devices used in optical metrology of semiconductor structures typically use focused beams to produce small spot sizes (in the order of μm). Thus, for a photometric device that uses a focused beam, the measured diffraction signal is the integration of the measured diffraction signals corresponding to all the pencil rays in the effective numerical aperture (NA) of the photometric device. Each ray in the NA corresponds to a specific angle of incident (AOI) and wavelength. Additionally, the square of the absolute value of the complex reflection coefficients (CRCs), $r_s$ and $r_p$, and thus the parameters (R, NSC), are functions of angle of incidence (AOI), where R is the reflectivity defined below. Because of the dependence on AOI, the focusing beam is depolarized.

Thus, in general, the ellipsometer parameters ($\rho = \tan \Psi e^{i\Delta}$) are no longer sufficient to describe the characteristics of the focused beam. Additionally, in general, the definitions in equations (2)-(5) need to be reconsidered, and one can expect that the expression $\sqrt{N^2 + S^2 + C^2} \equiv \beta$ may no longer equal 1. Moreover, depolarization is not only limited by NA integration, it also can be the result of finite spectral resolution or other effects.

For an exemplary photometric device, the measured diffraction signals can be characterized by the following relationship:

$$I = PSD \cdot M \cdot PSG \quad (6)$$

where PSD is the row vector representing the response of the polarization state detector to the Stokes parameters of polarized light, PSG is the column vector representing Stokes parameters of the light created by the polarization generator, and M is the Muller matrix. The vectors PSD and PSG are not a function of AOI and wavelength. For a specific ray (with given AOI and wavelength), the Muller matrix can be written as:

$$M(AOI, \lambda) = \begin{pmatrix} Rp + Rs & Rp - Rs & 0 & 0 \\ Rp - Rs & Rp + Rs & 0 & 0 \\ 0 & 0 & \text{Re}(Rsp) & \text{Im}(Rsp) \\ 0 & 0 & -\text{Im}(Rsp) & \text{Re}(Rsp) \end{pmatrix}. \quad (7)$$

where Rs, $p = |r_{s,p}|^2$, $Rsp = r_s r_p^*$ and $r_s$, $r_p$ are the complex reflection coefficients.

For a photometric device using a focused beam, the measured diffraction signals are the intensity integration of all the pencil rays over the NA and detector bandwidth around the center wavelength of the photometric device. This integration can be done solely for the Muller matrix as follows:

$$I = \theta I(AOI, \lambda) d\Omega_{AOI} d\lambda = PSD \cdot (\partial M(AOI, \lambda) d\Omega_{AOI} d\lambda) \cdot PSG. \quad (8)$$

Then, the generalized parameters (R, NSC) can be defined as follows:

$$R = \frac{\int (Rp + Rs) d\Omega_{AOI} d\lambda}{2 \int d\Omega_{AOI} d\lambda} \quad (9)$$

$$N = -\frac{\int (Rp - Rs) d\Omega_{AOI} d\lambda}{\int (Rp + Rs) d\Omega_{AOI} d\lambda} \quad (10)$$

$$S = \frac{\int \text{Im}(Rps) d\Omega_{AOI} d\lambda}{\int (Rp + Rs) d\Omega_{AOI} d\lambda} \quad (11)$$

$$C = \frac{\int \text{Re}(Rps) d\Omega_{AOI} d\lambda}{\int (Rp + Rs) d\Omega_{AOI} d\lambda}. \quad (12)$$

The above measurement and analysis procedure of equations (8)-(12) are performed around the center wavelength of the photometric device, and the results form a spectrum of I and (R, N, S, C). The photometric device may measure the center wavelengths one at a time, or measure all center wavelengths in parallel. The interface and signal processing module may convert and process the measured spectra when data for a portion of the center wavelengths is available, or after the data of all center wavelengths is available.

R characterizes the change in intensity of light when reflected on a structure. More particularly, R is an average of the square of the absolute value of the complex reflection coefficients. NSC characterizes the change in polarization states of light when reflected on the structure. N is half of the normalized differences between the reflectivity. S is the imaginary component, and thus the out-of-phase component, of the interference of the complex reflection coefficients normalized to R. C is the real component, and thus the in-phase component, of the interference of the complex reflection coefficients normalized to R. Additionally, when a 45 degree linear polarized light is used, and thus the input Stokes parameters are $S_0=1$, $S_1=0$, $S_2=1$, and $S_3=0$, then the output stokes parameters correspond to R, NSC as $S_0=R$, $S_1=-R \times N$, $S_2=R \times C$, and $S_3=-R \times S$.

With equations (9)-(12), the normalized Muller matrix can be expressed as:

$$M' = \begin{pmatrix} 1 & -N & 0 & 0 \\ -N & 1 & 0 & 0 \\ 0 & 0 & C & S \\ 0 & 0 & -S & C \end{pmatrix}. \quad (13)$$

Thus, the measured diffraction signals can be characterized as:

$$I = PSD \cdot (RM') \cdot PSG. \quad (14)$$

In general, $\sqrt{N^2+S^2+C^2}=\beta \leq 1$, and (R, NSC) are four (4) independent parameters. The parameters (R, NSC) can describe completely the reflection characteristics of isotropic structures, such as thin film, but they do not describe polarization cross coupling that exists in anisotropic structures, such as periodic gratings. However, using an azimuth angle of 90° eliminates the contribution of polarization cross coupling effects. The parameters R and M', or equivalently (R, NSC), are functions of the conditions that are measured such as the center AOI, center wavelength, effective NA, spectral resolution, and the like. From the definition of the parameters R and M', or equivalently (R, NSC), these quantities can be simulated for fitting, once the information about center AOI, center wavelength, effective NA and spectral resolution are available. The fitting can be done using techniques of either library-based or regression-based or machine learning-based processes. For a more detailed description of an interface for an optical metrology system, see U.S. Pat. No. 7,064,829, titled GENERIC INTERFACE FOR AN OPTICAL METROLOGY SYSTEM, issued on Jun. 20, 2006, which is incorporated herein by reference in its entirety.

As mentioned above, as the size of the structures get smaller, factors that did not substantially affect the measurement accuracy are now making an impact. Furthermore, assumptions used in modeling the optical metrology tool are no longer sufficient. FIGS. 4-11B are exemplary architectural diagrams of considerations regarding the physical optics, geometric optics, beam propagation parameters, and detail analysis of the effect of imperfections of optical components on the illumination and diffraction beams that need to be accounted for in the modeling of the optical metrology tool and simulations of the diffraction signal to be used in the profile parameter extraction system.

Figure 4:
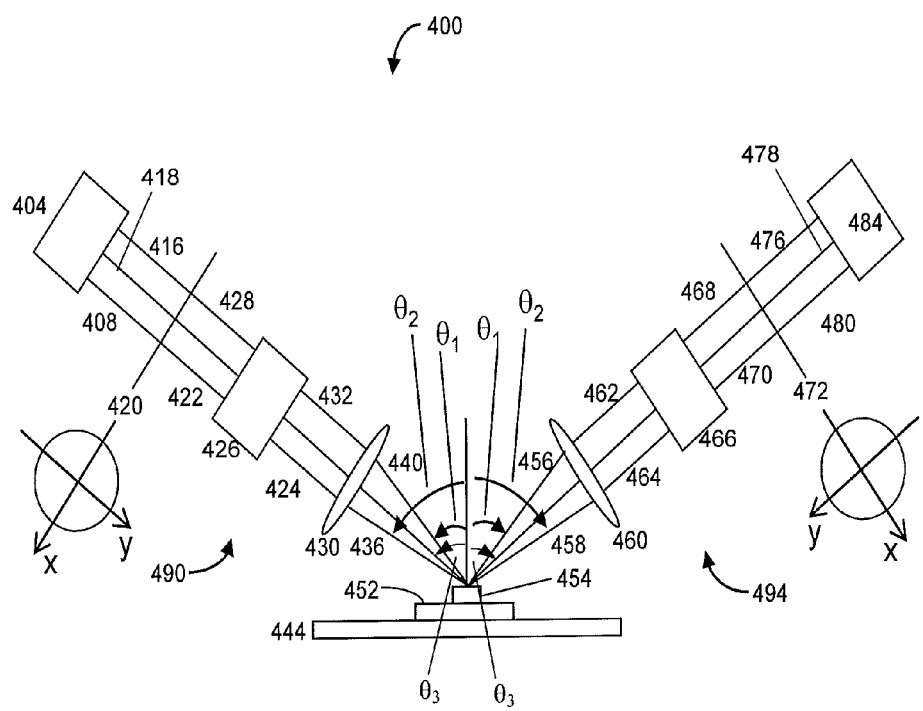
FIG. 4 depicts an exemplary architectural diagram of an optical metrology tool using ray tracing methodology.

FIG. 4 depicts an exemplary architectural diagram of an optical metrology tool using ray tracing methodology. For illustration purposes, only three rays are used, however, the number of rays used in ray tracing can be a single ray, or two or more rays. The optical metrology tool 400 is illustrated using three rays from the light source 404 through optical metrology elements 426 and 430, where the rays are directed to a structure 454 on the workpiece 452. The workpiece 452 is disposed on a motion control system 444 which is configured to adjust the focus of the illumination beam onto the workpiece 452. In the current diagram, each ray is traced through all the optical elements in the illumination portion 490 and the detection portion 494 of the optical metrology tool 400 up to and including the detector 484. The first illumination ray 408 originating from the light source 404 is transmitted as a ray 422 through optical element 426, which can include a collimator, polarizer and/or a compensator, generating an output ray 424. The output ray 424 is transmitted to the focusing element 430, generating output ray 436 onto the structure 454 at an angle of incidence of $\theta_2$. The second illumination ray 416 proceeds as ray 428, passing through the illumination optical element 426 as output ray 432. As mentioned above, the illumination optical element 426 can include a collimator, polarizer and/or a compensator. The output ray 432 is transmitted to the focusing element 430, generating output ray 440 onto the structure 454 at a second angle of incidence of $\theta_1$. The cross-section 420 of the illumination beam consists of many rays, and only representative rays need to be traced through the system. The electric and magnetic field of each ray can be linearly or elliptically polarized, and the position of the rays may be in any location within the cross-section defined by X and Y. The focusing optical element 430 may be a reflective or a refractive optical element.

With reference to FIG. 4, output illumination ray 436 transmitted to the structure 454 is diffracted as detection ray 458 at a first diffraction angle the same as the angle of incidence $\theta_2$. The detection ray 458 is transmitted to a collecting optical element 460 generating a detection ray 464, through the collecting optical element 460 as a diffraction ray 464, generating output ray 470, proceeding as a detection ray 480 onto the collector 484. The collecting optical element 466 may include a collimating lens, compensator and/or a collection polarizer, also referred to as an analyzer. Other optical elements may be included on the collection portion 494 in order to direct the collection rays onto the detector 484 where detector 484 may comprise one or more detectors to resolve rays angularly such as $\theta_1$ and $\theta_2$, and/or resolve the wavelength of the rays using a dispersion component such as a grating. Similarly, output illumination ray 440 is transmitted to the structure 454 and diffracted as a detection ray 456 at an angle the same as the first angle of incidence $\theta_1$. The detection ray 456 is transmitted to the collecting optical element 460 generating detection ray 462, through collecting optical element 466, generating ray 468, proceeding as a detection ray 476 onto the collector 484. As mentioned above, the collecting optical element 466 may include a collimating lens, compensator and/or a collection polarizer, also called an analyzer. Other optical elements may be included in the collection portion 494 in order to direct the collection ray onto the detector 484 where detector 484 may comprise one or more detectors. The cross-section 472 of the detection beam consists of many rays, and each of the rays can be linearly or elliptically polarized, and the position of the rays may be in any location within the cross-section defined by X and Y. The center ray 418, also known as chief ray, can be traced in the same manner as the first two rays, i.e., through the illumination optical elements, 426 and 430, transmitted onto the structure 454 at an incident angle $\theta_3$, diffracted at a similar angle $\theta_3$ from the structure 454 and transmitted through detection optical elements, 460 and 466, and transmitted to the detector 484 as output ray 478. If four rays are used to model the optical metrology tool 400, each of the rays are similarly traced through all of the optical elements in the illumination portion 490 and the detection portion 494 of the optical metrology tool 400 up to and including the detector 484. Similarly, if five rays are used to model the optical metrology tool 400, each of the rays are similarly traced through all of the optical elements in the illumination portion 490 and the detection portion 494 of the optical metrology tool 400 up to and including the detector 484. As mentioned above, the number of rays selected to model the metrology tool 400 can be one or more rays based on the application and objectives of the measurement. As seen in the three-ray example of FIG. 4, the first angle of incidence $\theta_2$ of the output illumination ray 436 on the structure 454 on the workpiece 452 can be different for each ray. Furthermore, as will be discussed in connection with FIGS. 5A through 10B, other factors can affect propagation parameters, such as the angle of incidence, azimuth angle, intensity, polarization, phase delay, and the like at each optical element up to and including the detector 484.

Figure 5A:
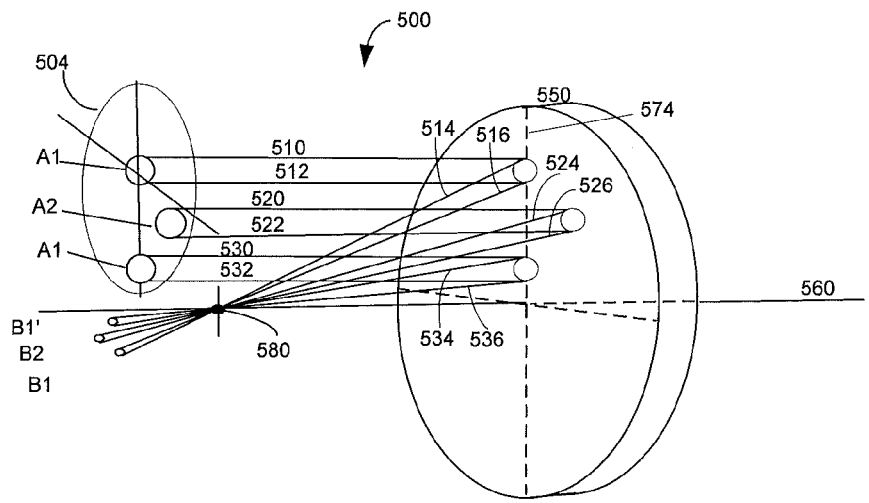
FIG. 5A depicts an architectural diagram illustrating use of ray tracing with a reflective optical element where a ray may enter in the incident plane or off the incident plane of the reflective optical element.

FIG. 5A depicts an architectural diagram illustrating ray tracing 500 with a reflective optical element 550 such as a mirror, with an optical axis 560 as depicted. The mirror 550 has an incident plane 574, the incident plane being the surface at which the projections of an input and output chief rays intersect. Using a three-ray model, input rays, 510 and 512, with a differential cross section of A1 are reflected in the incident plane 574 as output rays, 514 and 516, with a differential cross section B1. In another instance, input rays 520 and 522, are transmitted onto the reflective optical element 550 with an output differential cross section of B2. However, the input rays, 520 and 522, are reflected outside of the incident plane 574 and instead are reflected as output rays, 524 and 526, with a different differential cross section B2. Differential cross section of B2 may be smaller or bigger than differential cross section B1. In another instance, 530 and 532, with a differential cross section of A1 are reflected in the incident plane 574 as output rays, 534 and 536, with a differential cross section B1.

Figure 5B:
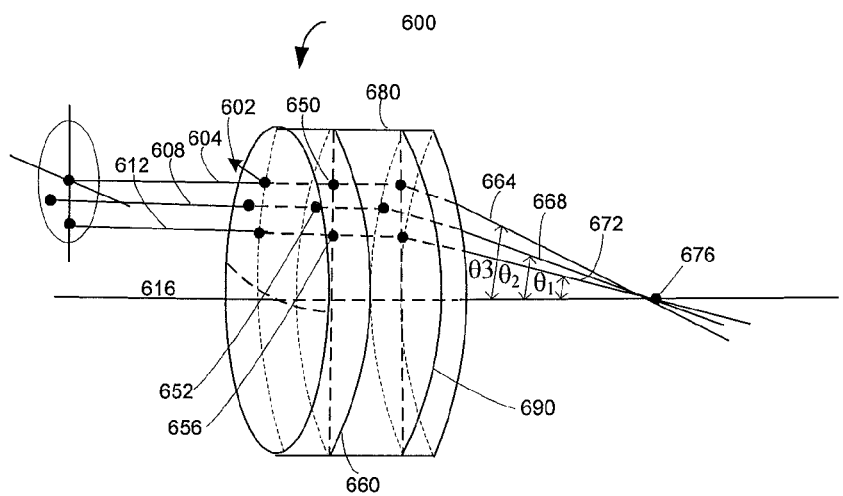
FIG. 5B depicts an architectural diagram illustrating use of ray tracing with a refractive optical element where a ray may enter in the incident plane or off the incident plane of the refractive optical element.

FIG. 5B depicts an architectural diagram illustrating ray tracing 600 with a refractive optical element 680, for example a focusing lens, and an optical axis 616. The chief ray 604 and the optical axis 616 form the incident plane. Using a two-ray model, input ray 612 enters the first principal plane 660 in the incident plane at a point 656, is transmitted through the refractive optical element 680 and the second principal plane 690 as an output ray 672 at a first angle of incidence $\theta_1$ in the direction of the focal point 676. Another input ray 608 enters the refractive optical element 680 at the first principal plane 660 outside the incident plane at a point 652, is transmitted through the refractive optical element 680, and exits the second principal plane 690, as output ray 668 at a second angle of incidence $\theta_2$ in the direction of the focal point 676. The chief ray 604 enters the first principal plane at a point 650, is transmitted through the refractive optical element 680, and exits the second principal plane 690 as output ray 664 at third angle of incidence $\theta_3$.

Figure 6A:
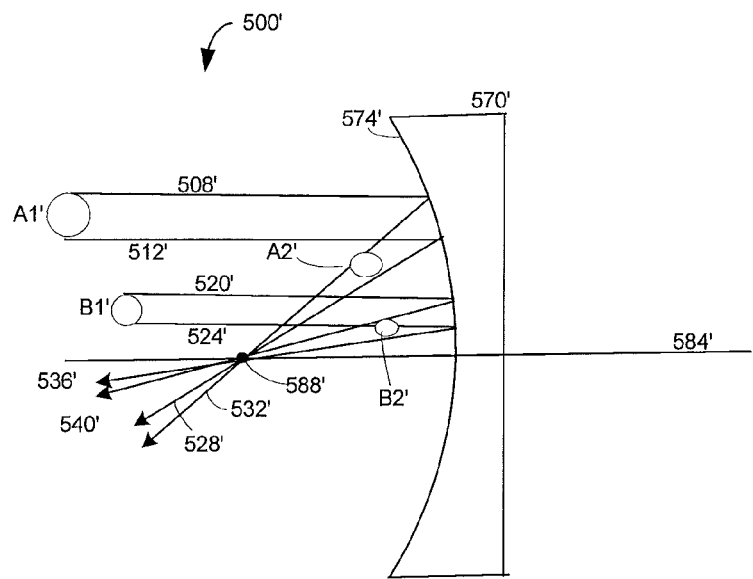
FIG. 6A depicts an architectural diagram illustrating use of ray tracing in a reflective optical element that involves magnification or demagnification variation across the section of the output ray.

FIG. 6A depicts an architectural diagram 500' illustrating ray tracing with a reflective optical element 570', with an optical axis 584', that involves variation of magnification or demagnification of the output ray over the cross section of the beam. The input rays, 508' and 512', with a differential cross section of A1' are reflected by the mirror 570' as output rays, 528' and 532', with a differential cross section A2', converging on the focal point 588'. In another instance, input rays, 520' and 524', with a differential cross section of B1' are transmitted onto the reflective optical element 570', are reflected as output rays, 536' and 540', with a different differential cross section B2', converging on the focal point 588'. When the differential cross section A1' and B1' are measured on the same plane perpendicular to propagation direction of the chief ray (not shown), and the differential cross section A2' and B2' are measured on the other plane perpendicular to the propagation direction of the chief ray (not shown), then the magnification m can be calculated for input rays 508' and 512' as $$m_A = \frac{A_2'}{A_1'};$$

and for input rays 520' and 524' as $$m_B = \frac{B_2'}{B_1'}.$$

Due to geometrical considerations, the magnification across the beam section may vary, that is $m_A \neq m_B$. Even with a uniform intensity distribution input beam, this magnification variation introduced by optical components causes the intensity variation across the beam. This is an unwanted system artifact and will introduce measurement error. For example, assume an intensity uniform beam from the light source, the beam passes through a series of optical components and then focused onto the structure. When a ray is traced from the light source with a differential cross section A1, the differential solid angle of the first ray, $\Omega_1$, when focused onto the structure can be calculated with a ray trace algorithm, so that the angular intensity of the ray focused onto the structure is $$I_1 = I_0 \cdot \frac{\Omega_1}{A_1}.$$

The differential solid angle of a second ray, $\Omega_1$, can be calculated with the same ray tracing algorithm, and is $$I_2 = I_0 \cdot \frac{\Omega_2}{A_2}.$$

Typically the angular intensity distribution is non-uniform, i.e. $I_1 \neq I_2$, due to the geometric magnification non-uniformity, i.e.

$$\frac{\Omega_1}{A_1} \cong \frac{\Omega_2}{A_2} \text{ or } \frac{\Omega_1}{A_1} > \frac{\Omega_2}{A_2} \text{ or } \frac{\Omega_1}{A_1} < \frac{\Omega_2}{A_2} \quad (15)$$

wherein
$\Omega_1$ is the differential solid angle open from the focused point on the target of the input beam with differential cross section A1, and $\Omega_2$ is the differential solid angle open from the focused point on the target of the input beam with differential cross section A2 respectively, and $A_1, A_2$ are the differential area of the cross sections of the two incident rays at the source aperture plane, respectively.

Due to this angular magnification non-uniformity, the angular intensity distribution over the numerical aperture (NA) is non-uniform and will change the NA weighting functions in the NA integration algorithm and can cause systematic errors in the calculations of the intensity and polarization of the diffraction signal.

Figure 6B:
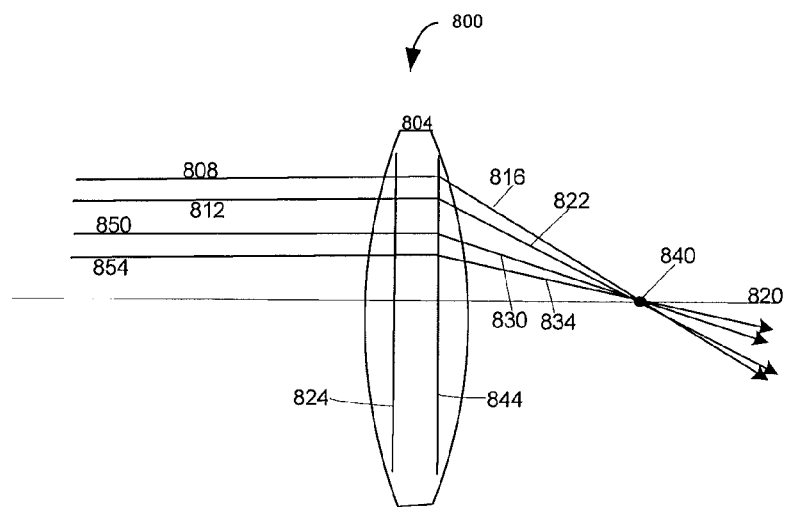
FIG. 6B depicts an architectural diagram illustrating use of ray tracing with a refractive optical element that involves magnification or demagnification variation across the section of the output ray.

FIG. 6B depicts an architectural diagram 800 illustrating ray tracing with a refractive optical element 804, for example a lens, with an optical axis 820, that shows magnification or reduction of the cross section of the output rays. Consider a two-ray model comprising two input rays, 808 and 812, entering the refractive optical element 804, proceeding through the refractive optical element 804 and the first principal plane 844, exiting as refracted rays, 816 and 822 towards the focal point 840. In a different model, a two-ray model comprising two input rays, 850 and 854, entering the refractive optical element 804, proceeding through the refractive optical element 804 and the first principal plane 844, exiting as refracted rays, 830 and 834 towards the focal point 840. The second principal plane 824 is used for ray tracing when a different ray or rays are directed through the refractive optical element from the opposite direction. As mentioned in FIG. 6A, rays may have variation of magnification or demagnification of the output ray over the cross section of the beam. Ray tracing enables each optical element, reflective or refractive elements, in the optical metrology tool to be modeled allowing for changes to the direction and attributes of the rays while entering, proceeding, and exiting the optical element.

Figure 7A:
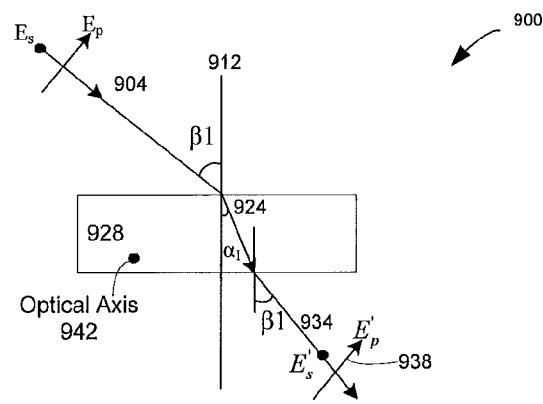
FIG. 7A depicts an architectural diagram illustrating use of ray tracing with an optical element depicting strain birefringence in the output ray.

FIG. 7A depicts an architectural diagram 900 illustrating ray tracing in an optical element depicting strain birefringence in the output ray. Birefringence is the separation of light beams as the beam penetrates a doubly refracting object, into two diverging beams, commonly known as ordinary beam and extraordinary beam. Strain birefringence occurs due to external forces and/or deformation acting on the materials, for example, stretched fibers, thin film material, or strain caused by adhesive used in manufacturing the optical metrology tool. Consider a single input ray 904, with the electromagnetic field expressed as $E_s$ and $E_p$, entering the surface of a doubly refracting material 928 at an angle of incidence $\beta 1$ relative to the normal line 912. The doubly refracting material 928 has an Optical Axis 942 perpendicular to the plane of the paper. The input ray 904 is refracted by the doubly refracting material 928 at an angle $\alpha_1$ refracted ray 924. Refracted ray 924 emerges from the doubly refracting material as two rays, ordinary output ray 934 and extraordinary output ray 938 where polarization of the ordinary output ray 934 exiting the material 928 is the same as the polarization of the input ray 904. The exit angle $\beta_1$ of the output ray 934 is the same as the angle of incidence of the input ray 904. Polarization of the ordinary output ray 934 is perpendicular to the polarization of extraordinary output ray 938. The phase retardation, $\delta$, between the ordinary output ray 934 and extraordinary output ray 938 can be derived utilizing the output electromagnetic fields of the ordinary output ray 934 and the extraordinary output ray 938. $E_o$ is the input electromagnetic field of the ordinary output ray 934 and its output can be calculated as follows:

$$E_e e^{i\frac{2\pi}{\lambda} n_e \cdot l}.$$

$E_e$ is the input electromagnetic field of the extraordinary output ray and its output ray can be calculated as follows:

$$E_o e^{i\frac{2\pi}{\lambda} n_o \cdot l}.$$

The total electric field of the ordinary and extraordinary output rays $\vec{E}$, can be calculated as follow $$\vec{E} = e^{i\frac{2\pi}{\lambda} \frac{(n_o+n_e)}{2} \cdot l} \cdot (E_o \vec{e}_o + E_e e^{i\delta} \vec{e}_e) \qquad (16)$$

The phase retardation, i.e. the phase shift between ordinary and extraordinary output rays can be calculated as follows:

$$\delta = \frac{2\pi}{\lambda}(n_e - n_o) \cdot l \qquad (17)$$

where $i=\sqrt{-1}$ which is the unit of imaginary number, $\lambda$ is the wavelength in vacuum, and l is the thickness of the material. Because of the phase retardation, the polarization of the light changed from the input state ($E_o \vec{e} + E_e \vec{e}_e$) to the output state ($E_o \vec{e}_o + E_e e^{i\delta} \vec{e}_e$). Typically, prior art ignored the strain birefringence or its variation across the section of the beam for most of the optical components, which causes errors in the simulation of diffraction signals used in the profile extraction process.

Figure 7B:
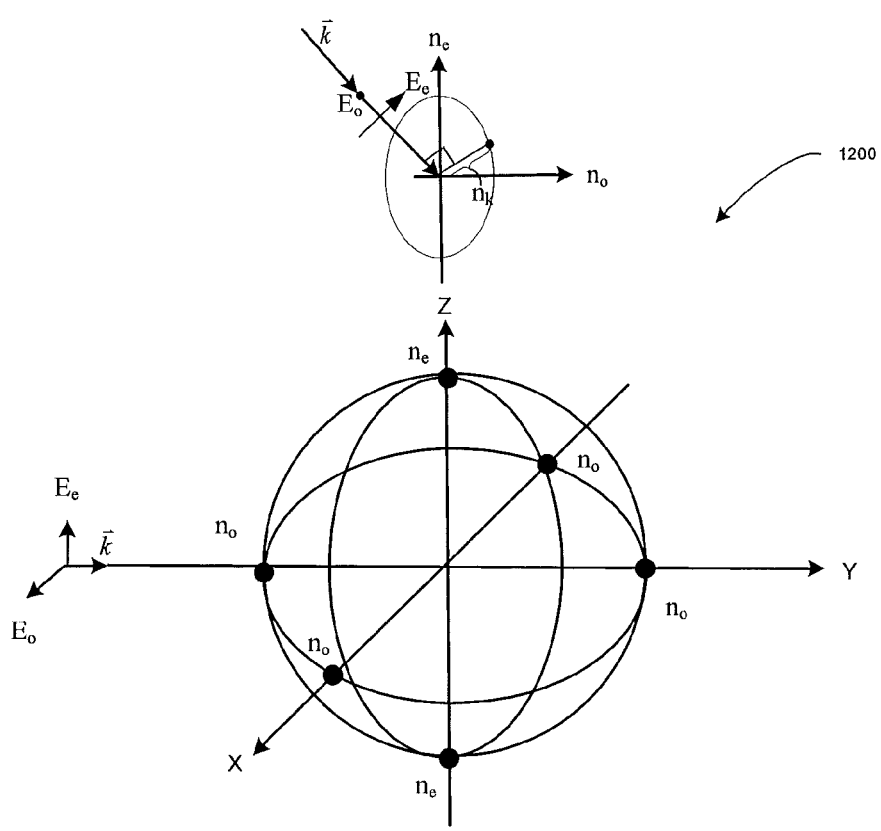
FIG. 7B depicts an architectural diagram illustrating a bi-axial representation of a light wavefront, comprising the electric field of the ordinary ray $E_o$ and the electric field of the extraordinary ray $E_e$.

FIG. 7B depicts an architectural diagram 1200 illustrating refractive index change with propagation direction and polarization of light in a bi-axial birefringence material, the electric field of the input beam comprising the electric field of the ordinary ray $E_o$ and the electric field of the extraordinary ray $E_e$. The first axis of the birefringence elliptical sphere is in the horizontal plane for the ordinary ray and is expressed as refractive index $n_o$. The second axis is in the vertical direction for the extraordinary ray $E_e$ and is expressed as refractive index $n_e$. The electric field directions are also characterized with respect to the direction of the axes of the birefringence crystal axes, and can be decomposed into ordinary ray $E_o$, and extraordinary ray $E_e$. In this exemplary case, the ordinary and extraordinary rays propagate in the same direction, but polarizing in perpendicular directions, have different refractive index $n_o$ and $n_e$, and thus experience different phase retardation $$\delta = \frac{2\pi}{\lambda}(n_e - n_o) \cdot l$$

after the rays propagate a distance 1 inside the material.

For the strain birefringence case, the birefringence ($n_e-n_o$), is a function of the amount of strain, and is typically not uniform across the beam. This non-uniformity causes the polarization state of rays to vary after the rays pass through the strain birefringence material, even if the input rays are in the same polarization state. This is called the depolarization by strain birefringence. As will be explained in connection with FIGS. 9A and 9B, the polarization state of output rays can be changed from the input ray with non-uniformity across the beam, and these changes are expressed in terms of change in phase, amplitude, and direction of the polarization state. This is another source of depolarization of light propagating in the optical metrology system, and this type of depolarization can be calculated more accurately in ray tracing method described in this invention; the error caused by this error source is typically ignored in prior art.

Figure 8:
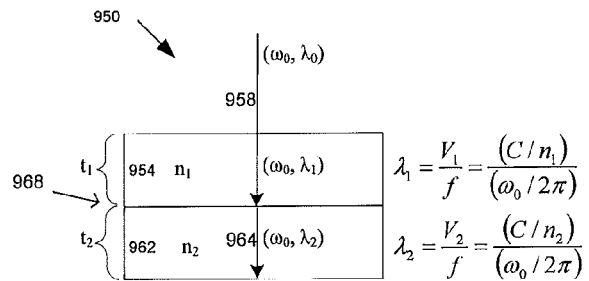
FIG. 8 depicts an architectural diagram illustrating ray tracing in a refractive optical element that depicts change of wavelength of the output ray.

FIG. 8 depicts an architectural diagram 950 illustrating ray tracing with a refractive optical element that depicts change of wavelength of the output ray when the ray propagates in a different optical material. Referring to FIG. 8, a monochromatic beam of light 958 is directed to an object 968 comprising two layers of different materials where the first layer 954 has an index of refraction $n_1$ and the second layer 962 has an index of refraction $n_2$. The wavelength of the ray in the second layer 962 is different from the wavelength of the ray in the first layer 954, as determined in equation:

$$\text{Wavelength } \lambda = \frac{V_2}{f_0} = \frac{(C/n_2)}{(\omega_0/2\pi)} = \frac{\lambda_0}{n_2}; \lambda_0 = \frac{C}{(\omega_0/2\pi)} \quad (18)$$

where $V_2$ is the speed of light in the second layer, C is the speed of light in a vacuum, n is the refractive index of the layer, (where n is constant for isotropic materials), f is the frequency, $\omega_0$ is the angular frequency of the beam and $\lambda_0$ is the wavelength in a vacuum. When spectroscopic light is used for illumination in optical metrology tools, the change in wavelength needs to be considered for integrating the simulation of diffraction signals in the profile extraction process to remove the chromatic effects of the optical system.

Figure 9B:
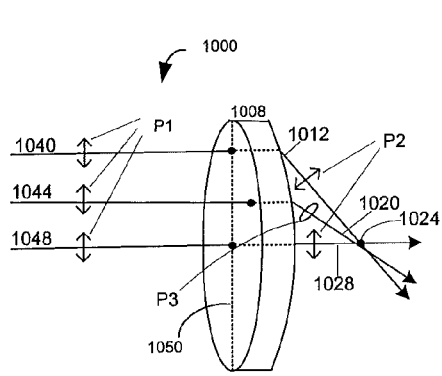
FIG. 9B depicts an architectural diagram depicting the polarization changes as a ray is reflected by a reflective optical element.
Figure 9B:
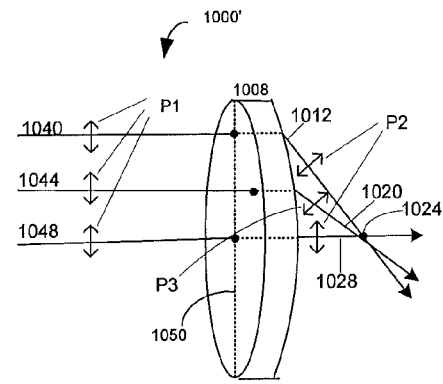
Figure 9B:
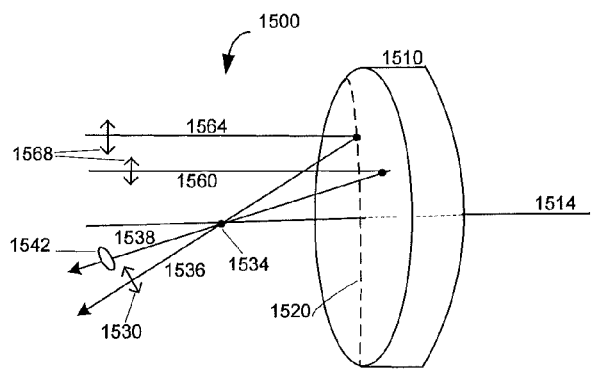

FIGS. 9A1 and 9A2 depicts an architectural diagram 1000 illustrating ray tracing where the polarization state changes as a ray is transmitted through refractive optical elements whereas FIG. 9B depicts an architectural diagram 1500 illustrating ray tracing where the polarization state changes as a ray is reflected by a reflective optical element. FIG. 9A1 illustrates ray tracing when there is birefringence of the diffracted beam as described in connection with FIG. 7A. The incident plane is defined by the chief ray and optical axis of the optical element. Referring to FIG. 9A1, the incident plane is the plane defined by the chief ray 1048 and the optical axis 1050. An input ray 1040 in the incident plane with linear polarization $P_1$ is transmitted as an output ray 1012 through a optical element 1008 with polarization $P_2$, typically also linearly polarized. A second input ray 1044 outside of the incident plane 1050 with the same linear polarization state $P_1$, is transmitted as an output ray 1020 through an optical element 1008, with polarization state P3. The chief ray 1048 in the incident plane is transmitted as output ray 1028; all the output rays converge at the focal point 1024. Typically, the polarization state P3 is not linearly polarized as a result of the ray transmitting through the front and back surfaces of the optical element 1008 outside the incident plane. Depolarization due to the non-uniform change of polarization state is ignored in prior art and is an artifact that cause systematic error. The electric field of the output rays may be linearly polarized, P2, for example, in output rays 1012 and 1028, or may rotate as the wave travels where the polarization may be described as circular or elliptical polarization, P3, for example, in output ray 1020. Referring to FIG. 9A1, $P_1$ may be linear, $P_2$ may be linear typically and $P_3$ may be elliptical. Conversely, $P_1$ may be unpolarized, so that the ray needs to be decomposed into orthogonal polarized light states, and each polarization state needs to be traced separately. The orthogonal polarized light is super-positioned at the detector in one of three ways: coherently, incoherently, or partial coherently depending on the polarization states of $P_1$.

FIG. 9A2 depicts an architectural diagram 1000' illustrating ray tracing where the polarization state changes as a ray is transmitted through refractive optical element and there is no birefringence of the refracted beam. Similar components FIG. 9A2 are numbered similarly as in FIG. 9A1. Input rays, 1040, 1044, and 1048, have a polarization P1 and are transmitted through the optical element 1008 as output rays, 1012 and 1028, with the polarization state P2 and as output ray 1020 with polarization P3. Since there is no birefringence, P1 may be linearly polarized, P2 and P3 may also be linearly polarized.

Referring to FIG. 9B, the polarization state of input ray 1564 may change when reflected by the reflective element 1510 within the incident plane defined by the chief ray (not shown) and optical axis 1520 of the reflective element 1510, as output ray 1536. Similarly, the polarization state of input ray 1560 may change, for example, from linearly polarized to non-polarized, when reflected outside of the incident plane of the reflective element 1510 as output ray 1538.

Figure 10A:
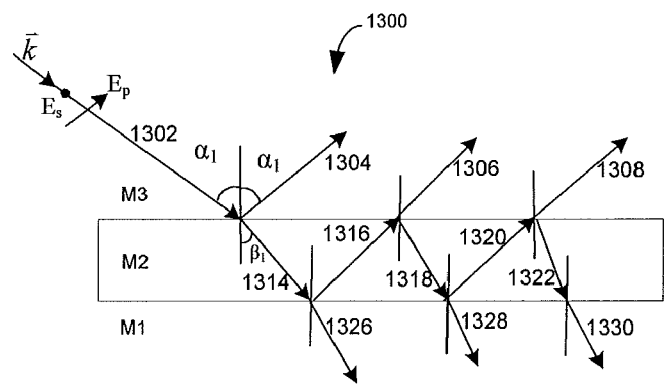
FIG. 10A depicts an architectural diagram illustrating ray tracing of refraction and reflection of a ray in a thin film layer.

FIG. 10A depicts an architectural diagram 1300 illustrating ray tracing of refraction and reflection of a ray in a thin film layer. Assume a beam of light depicted as single input ray 1302 at an oblique angle of incidence $\alpha_1$ is transmitted through material M3, for example, air. Input ray 1302 is partially reflected as a first reflection output ray 1304 at an angle $\alpha_1$ and partially refracted through material M2, for example, a wafer layer, as a first refracted ray 1314 at a refracted angle $\beta_1$. First refracted ray 1314 is further partially reflected at the lower boundary of material M2 as a reflected ray 1316 and partially refracted as a refracted ray 1326 through the next layer material M1. Reflected ray 1316 is partially transmitted as a second reflection output ray 1306 and partially reflected at the upper boundary of material M2 as a ray 1318 back into material M2. A second process of partial reflection and refraction is iterated for a ray 1318 that is partially diffracted as a ray 1328 through material M1 and partially reflected at as a ray 1320 through material M2 and partially refracted through the next layer of material M1, continuing the partial reflection of the ray 1322 back into the material M2, partial transmission of the ray 1330 into material M1, and partially transmitted as third reflection output ray 1308. Electromagnetic energy of the rays in the iterative process of reflection, refraction, and transmittance of the ray can be used to determine a desirable height of the thin film layer. Equations for determining reflection and transmittance of the input ray through a material layer is as follows:

Electromagnetic field E consists of Incident field, Total Reflected field, and Transmitted field, with each field having two polarization states, s and p, $$E_{s,out} = r_s \cdot E_{s,in} \quad (19)$$

$$E_{p,out} = r_p \cdot E_p \quad (20)$$

$$\text{Total Reflected Intensity} = \frac{1}{2}\epsilon(|E_s|^2 + |E_p|^2) \quad (21)$$

where
$\epsilon$ is a constant,
$r_s$ and $r_p$ are the complex reflection coefficients, and
E is the electromagnetic field.

Figure 10B:
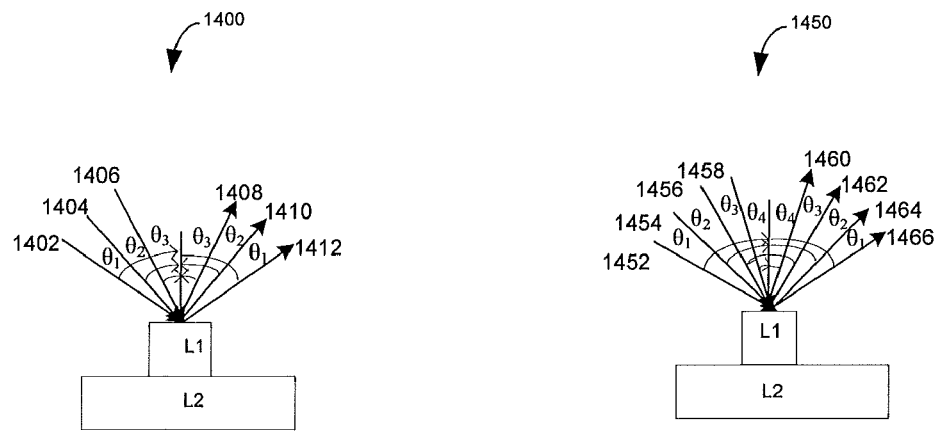
FIG. 10B depicts an architectural diagram illustrating ray tracing of multiple rays off a structure.

FIG. 10B depicts an architectural diagram illustrating ray tracing of multiple rays on a structure. Depicted in the first architectural diagram 1400 in three-ray model are input rays, 1402, 1404, and 1406, entering the structure L1 which is positioned on top of layer L2. The input rays, 1402, 1404, and 1406, enter the structure at different angles of incidence, $\theta_1$, $\theta_2$, and $\theta_3$ respectively, exiting as output rays 1412, 1410, and 1408 at angles of refraction $\theta_1$, $\theta_2$, and $\theta_3$, each respectively.

Depicted in the second architectural diagram 1450 in a four-ray model where input rays, 1452, 1454, 1456, and 1458 enter the structure at different angles of incidence, $\theta_1$, $\theta_2$, $\theta_3$, and $\theta_4$, respectively, exiting as output rays, 1466, 1464, 1462, and 1460, at angles of refraction $\theta_1$, $\theta_2$, $\theta_3$, and $\theta_4$ respectively. As shown in the various figures and architectural diagrams, the number of rays in the model using ray tracing can be 1 or more rays based on the requirements of the application. It should be noted that the computer resources needed to perform the simulation increase with the number of rays and an optimization process can be used to get the least number of rays based a time constraint, computer resource needs, and accuracy criteria.

Figure 11A:
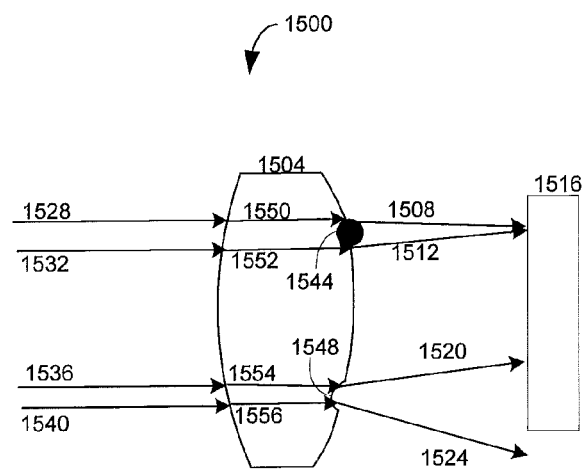
FIG. 11A depicts an architectural diagram illustrating ray tracing with a refractive optical element showing scattering and stray light effect.

FIG. 11A depicts an architectural diagram 1500 illustrating ray tracing with a refractive optical element 1504 describing scattering and stray light effects. In a two-ray model, input rays 1528 and 1532 enter a refractive optical element 1504, for example, a lens, where the rays are transmitted through the optical element 1504 as refracted rays, 1550 and 1552, where an impurity, 1544, for example, a residue or contamination inside or on the surface of the refractive optical element 1504, the output rays 1508 and 1512, have a smaller cross section due to convergence as the transmitted rays pass through the refractive optical element 1504 and around the impurity 1544. In another instance of the two-ray model, input rays 1536 and 1540, a surface defect 1548, for example, a dig or scratch, or an irregularity on the surface of the refractive optical element 1504, input rays 1536 and 1540, transmitted through the refractive optical element 1504 as refracted rays 1554 and 1556, generate output rays 1520 and 1524, that produce a wider cross section as the output rays 1520 and 1524 diverge. Output ray 1524 is directed outside of the detector 1516 detection area as a stray ray and may cause a scattering effect on the measurement. Stray rays such as output ray 1524 affect the measurements made by detector 1516. Ray tracing of the input and output rays are used to determine the direction of the rays that are transmitted to the detector 1516 and are accounted for in the simulation model for the optical metrology device for structure profile extraction.

Figure 11B:
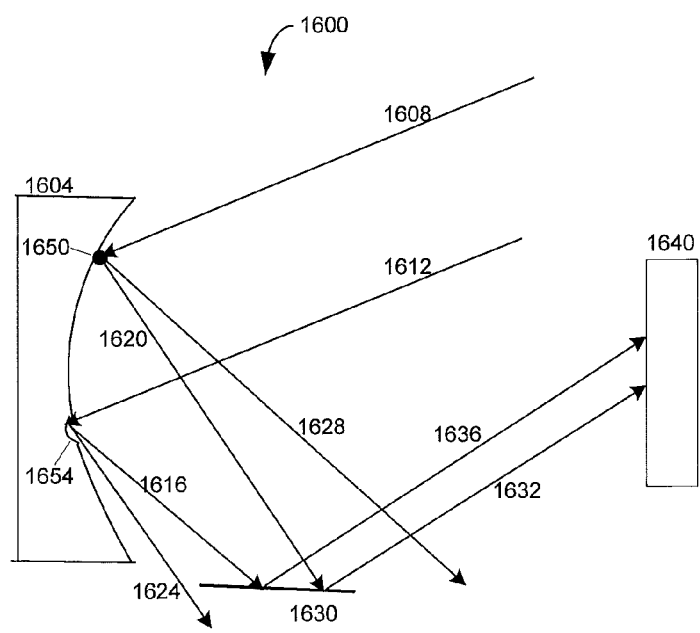
FIG. 11B depicts an architectural diagram illustrating ray tracing with a reflective optical element showing scattering and stray light effect.

FIG. 11B depicts an architectural diagram 1600 of a reflective optical element 1604 illustrating scattering and stray light effect. An input ray 1608 is reflected by a defect 1650 for example, residue or contamination inside or on the surface of the refractive optical element 1604, generating a first output ray 1620 directed to a component 1630 of the optical metrology tool (not shown) and is reflected as stray ray 1632 onto the detector 1640. A second output ray 1628 is not reflected to the detector 1640 and becomes a scattering ray. Another input ray 1612 is reflected as a first output ray 1616 by a cavity 1654, for example, a dig, scratch or an irregularity on the surface of the refractive optical element 1636 and is reflected by a component 1630 and reflected to the detector 1640 as stray ray 1636. A second output ray 1624 is reflected outside of the detection area of the detector 1640. Stray rays such as the output rays, 1636 and 1632, and scattering rays such the output rays, 1624 and 1628, affect the measurements made by detector 1640. Ray tracing of the input and output rays is used to determine the direction of the rays that are transmitted to the detector 1640. This data and other beam propagation parameters allows for integrating the changes in the model for the optical metrology tool used for structure profile extraction in order to meet total metrology accuracy requirements of an application.

Figure 12:
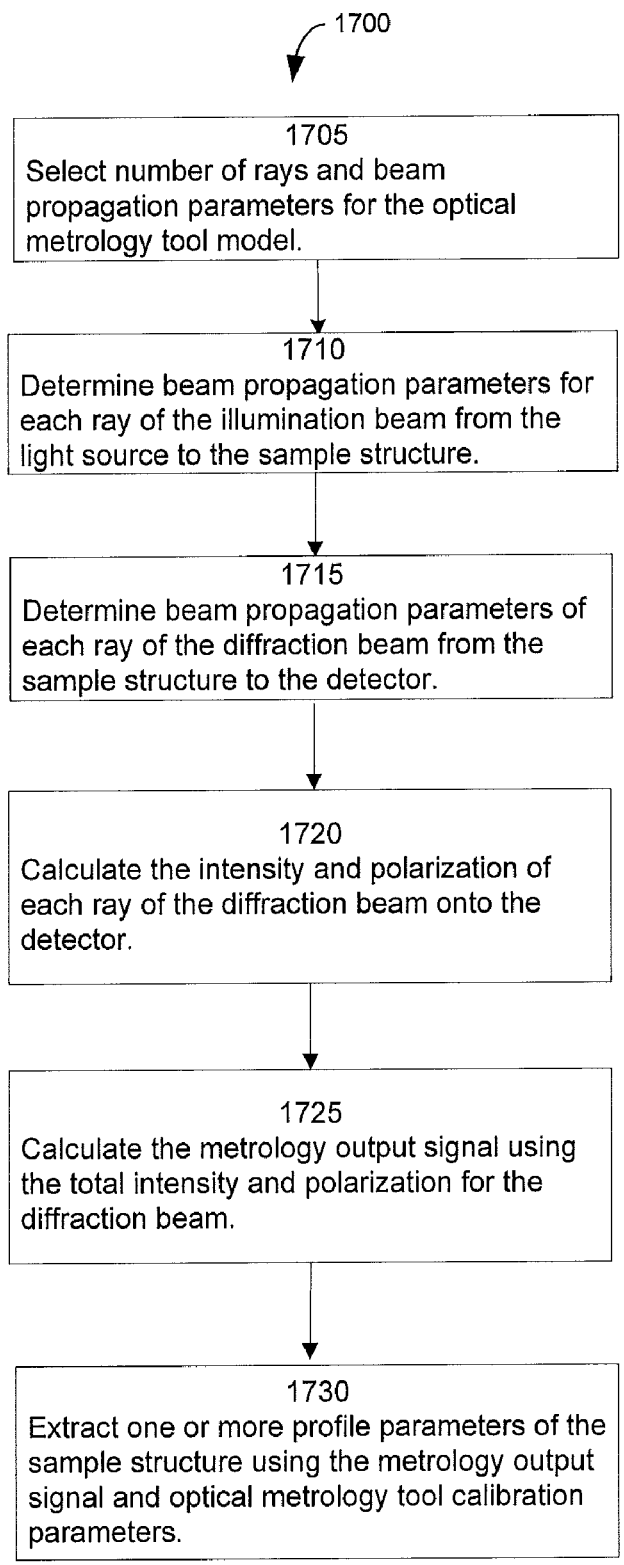
FIG. 12 depicts an exemplary flowchart for a method of determining a metrology output signal for extracting one or more profile parameters of the sample structure profile.

FIG. 12 depicts an exemplary flowchart 1700 for a method of calculating a metrology output signal for extraction of one or more profile parameters of the sample structure profile. In step 1705, the number of rays for modeling the optical metrology tool is selected. One ray, such as the chief ray, can be selected. In other embodiments, two or more rays can be selected. As mentioned above, the number of rays is based on the requirements of the application. Historical modeling data for the sample structure or similar structures and modeling data for the application or similar applications can be used as the basis for number selected. For example, if the application is a wafer structure, such as a developed photoresist that has been previously modeled using a three-ray model for a reflectometer, then in this instance, the starting number of rays for modeling a similar application can be 3. In step 1710, beam propagation parameters are selected for each ray from the light source to the sample structure. The sample structure can be patterned or unpatterned structures on a workpiece. The workpiece can include wafer structures such as thin film, gratings or repetitive structures, two-dimensional line and space structures, or three-dimensional structures. The beam propagation parameters may include one or more of angle of incidence, azimuth angle, plane of incidence, orientation of the ray, intensity, uniformity of intensity distribution across the cross section, polarization state, uniformity of polarization state change, spot of the ray on each optical element up to and including the sample structure, thin film transmittance and reflection, light scattering and stray light, and the like.

Uniformity of intensity distribution is affected by the delivery system of the light source, non-uniform transmission of intensity for the ray across optical elements, and/or non-uniform magnification of the ray. As mentioned above, non-uniform polarization state change of a ray may be caused by a defect in the optical element such as optical defects (FIGS. 11A and 11B), strain birefringence (FIGS. 7A and 7B), change of orientation relative to incident plane by reflective and diffractive optical elements (FIGS. 6A and 6B). Depolarization and changes to the polarization (FIG. 9A1, 9A2, and 9B) may be caused by birefringence and strain birefringence. Changes in the beam propagation parameters may also be due to thin film transmittance and reflection (FIGS. 10A and 10B), and light scattering and stray light effects (FIGS. 11A and 11B).

In step 1715, the selected beam propagation parameters are determined for each ray from the sample structure to the detector. In step 1720, the intensity and polarization of each of the selected rays are calculated, and integrated to generate the total intensity. For detailed description of a method for determining the intensity of a beam, see U.S. Pat. No. 7,064,829, titled GENERIC INTERFACE FOR AN OPTICAL METROLOGY SYSTEM, issued on Jun. 20, 2006, which is incorporated herein by reference in its entirety. In step 1725, the metrology output signal is calculated using the total intensity and polarization. In step 1730, one or more profile parameters of the sample structure are extracted using the metrology output signal, optical metrology tool calibration parameters, and a profile extraction system. As explained above, the profile extraction system may use regression, a library matching or a machine learning system.

Figure 13:
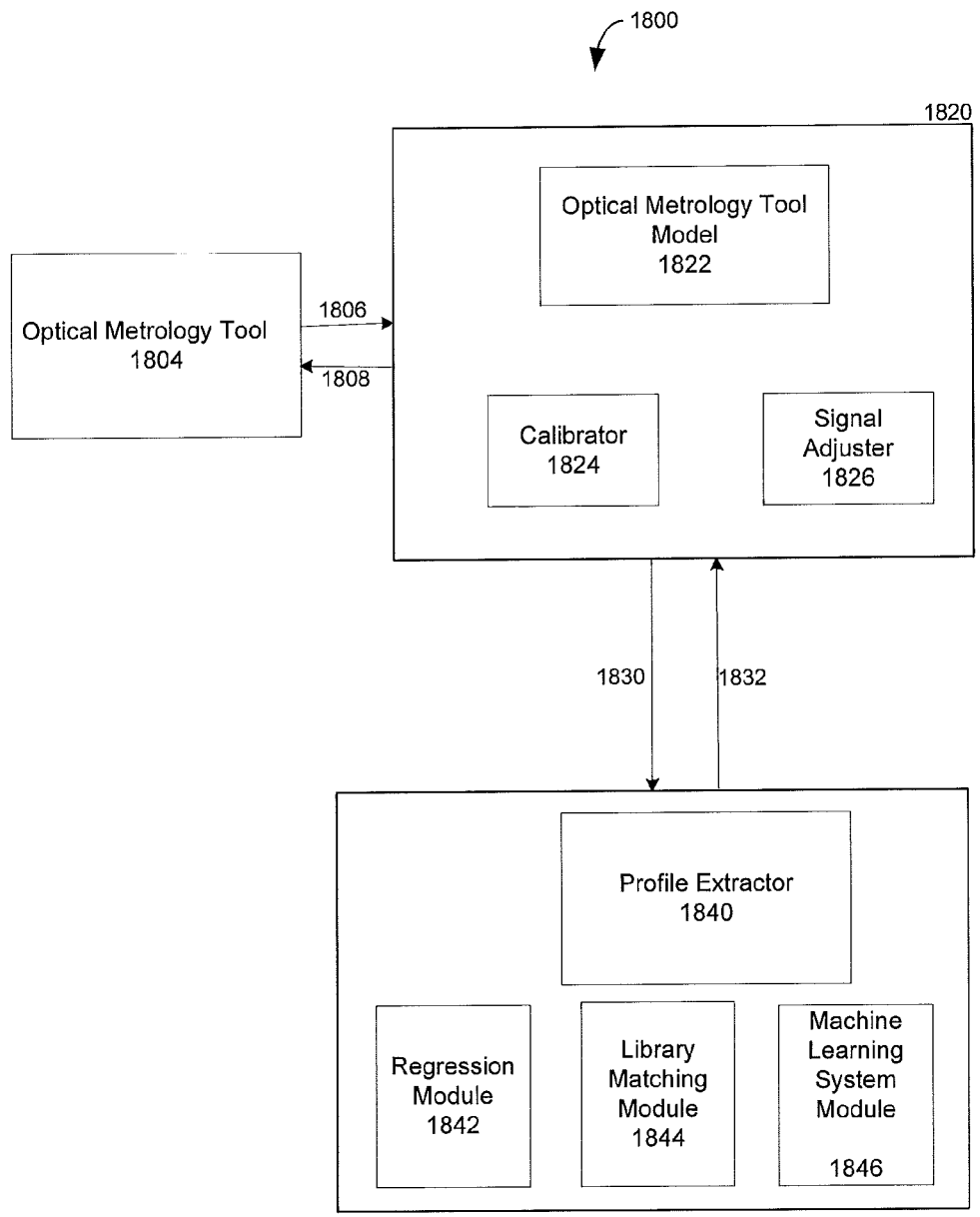
FIG. 13 depicts an exemplary block diagram of a system for measuring and determining sample profile parameters using an optical metrology tool and ray tracing methodology.

FIG. 13 depicts an exemplary block diagram of a system 1800 for determining sample profile parameters using an optical metrology tool 1804 and ray tracing methodology. The optical metrology tool 1804 is calibrated using the specifications from the optical metrology tool vendor and the calibrator 1824 in the processor 1820, generating calibration parameters. An optical metrology tool model 1822 is generated using the processor 1820, using the specifications of the optical metrology tool 1804 and specific operating settings of the optical metrology tool 1804 required for the application. The optical metrology tool model 1822 includes characterization of the illumination beam, the number of rays, the beam propagation parameters, calibration parameters and the like. Information 1806 regarding the structure (not shown) being measured is sent from the optical metrology tool 1804 to the signal adjuster 1826 in the processor 1820. The signal adjuster 1826 uses the optical metrology tool model 1822 and calibration parameters to convert the measured signal to an adjusted metrology output signal 1830 that is transmitted to the profile extractor 1840. The profile extractor can use a regression module 1842, a library matching module 1844, and/or a machine learning system 1846 to determine the desired one or more profile parameters 1832 of the structure to the processor 1820. The processor 1820 transmits feedback data 1808 such as information to change adjustable variables of the optical metrology tool 1804.

Figure 14:
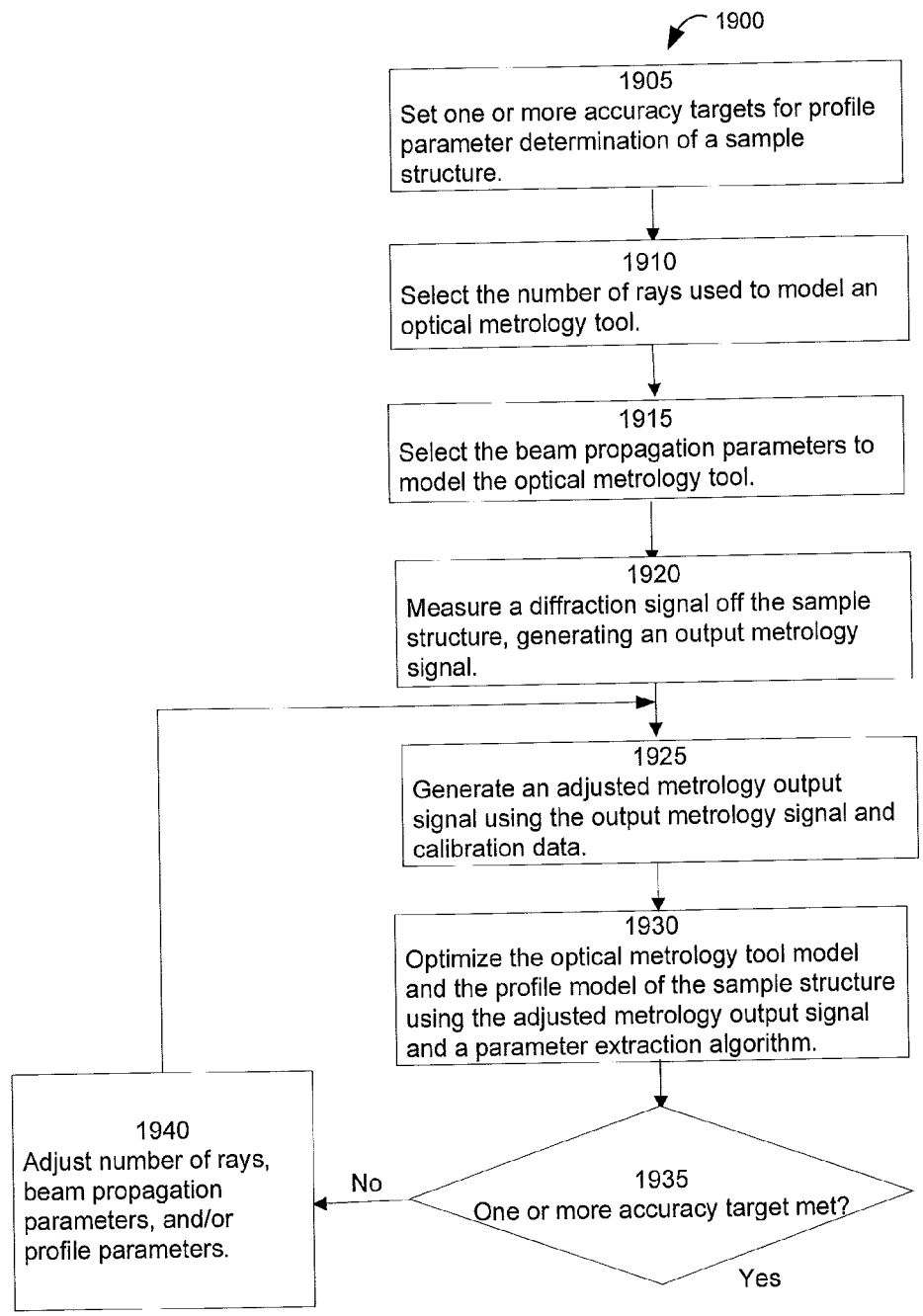
FIG. 14 depicts an exemplary flowchart for a method of optimizing the number of rays and beam propagation parameters concurrently with structure profile parameters of an optical metrology system.

FIG. 14 depicts an exemplary flowchart 1900 for a method of optimizing the number of rays and beam propagation parameters concurrently with structure profile parameters of an optical metrology system. In step 1905, one or more accuracy targets for profile parameter determination are set. Accuracy targets can include total measurement uncertainty (TMU), confidence interval (CI), standard uncertainty, combined standard uncertainty, expanded uncertainty, and the like. In an embodiment, the accuracy target is TMU where TMU is set to 0.50 or lower, a range of 0.60 to 0.20, or 0.40 or lower. In another embodiment, the accuracy target is TMU and CI where TMU is set to 0.50 or lower and CI is set to 90% or higher. In step 1910, the number of rays for the optical metrology tool model is selected. As mentioned above, one or more rays can be used.

In step 1915, beam propagation parameters are selected based on the effect on determined profile parameters of the structure. Selection of beam propagation parameters can be based on specifications of the optical metrology tool or historical data using the optical metrology tool and/or beam propagation parameters used for similar applications. Alternatively, in another embodiment, beam propagation parameters can be selected based on whether a parameter needs to be made variable or fixed. If the effect of setting a beam propagation parameter to a fixed value in the optical metrology tool model is negligible or less than a set threshold, then the parameter is set to a fixed value based on vendor data. In step 1920, the diffraction signal off the sample structure is measured, generating an output metrology signal. In step 1925, an adjusted metrology output signal is generated using the output metrology signal and calibration data. Calibration data is obtained from historical data, data from the vendors, or data from similar optical metrology tools. In step 1930, the optical metrology tool model and the profile model of the sample structure are concurrently optimized using the adjusted metrology output signal and a parameter extraction algorithm.

If the one or more accuracy targets are not met, step 1935, the number of rays, the selected beam profile propagation parameters, the beam propagation parameters, and/or the profile parameters are adjusted, in step 1940, and the generation of the adjusted metrology output signal, optimization of the optical metrology tool model and the profile model, and comparison steps are iterated until the one or more accuracy targets are met. For example, assume that the number of rays selected is 3 and the beam propagation parameters selected include angle of incidence, plane of incidence, orientation of the ray, intensity, uniformity of intensity distribution across the cross section, and polarization state are selected. Also assume that the one or more accuracy target is set at TMU at 0.50 or lower and CI of 90% or higher. The determined profile parameters of the sample structure using the adjusted metrology output signal and parameter extraction algorithm are compared to reference values of the profile parameters. Reference values may be obtained using a reference metrology tool such as a scanning electron microscope (SEM), an atomic force microscope (AFM) and the like or reference data obtained using a reference workpiece with known profile parameters. The TMU and CI of the determined profile parameters are compared to the set TMU of 0.50 or lower and CI of 90% or higher, respectively. If not met, the number of rays can be adjusted to 5, the beam propagation parameters selected can be adjusted to also include uniformity of polarization state change, thin film transmittance and reflection effect, light scattering effect, and/or stray light effect. The profile parameters can also be adjusted by changing the profile parameters that are made variable or fixed. The above process is iterated until the TMU of 0.50 or lower and CI of 90% or higher are met.

Figure 15:
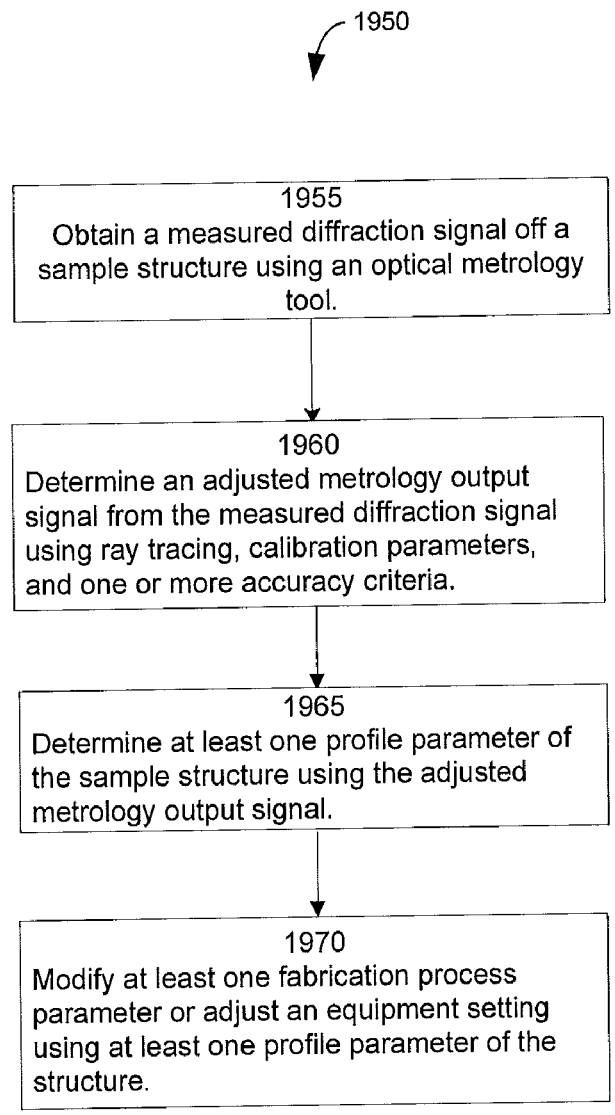
FIG. 15 is an exemplary flowchart for a method of determining and utilizing profile parameters for automated process and equipment control.

FIG. 15 is an exemplary block diagram 1950 of a system for determining and utilizing profile parameters for automated process and equipment control. In step 1955, a measured diffraction signal off a sample structure is obtained using an optical metrology tool. In step 1960, a metrology output signal is determined from the measured diffraction signal using ray tracing methodology, calibration parameters of the optical metrology device, and one or more accuracy criteria. In step 1965, at least one profile parameter of the sample structure is determined using the metrology output signal. In step 1970, at least one fabrication process parameter or an equipment setting is modified using at least one profile parameter of the structure.

Figure 16:
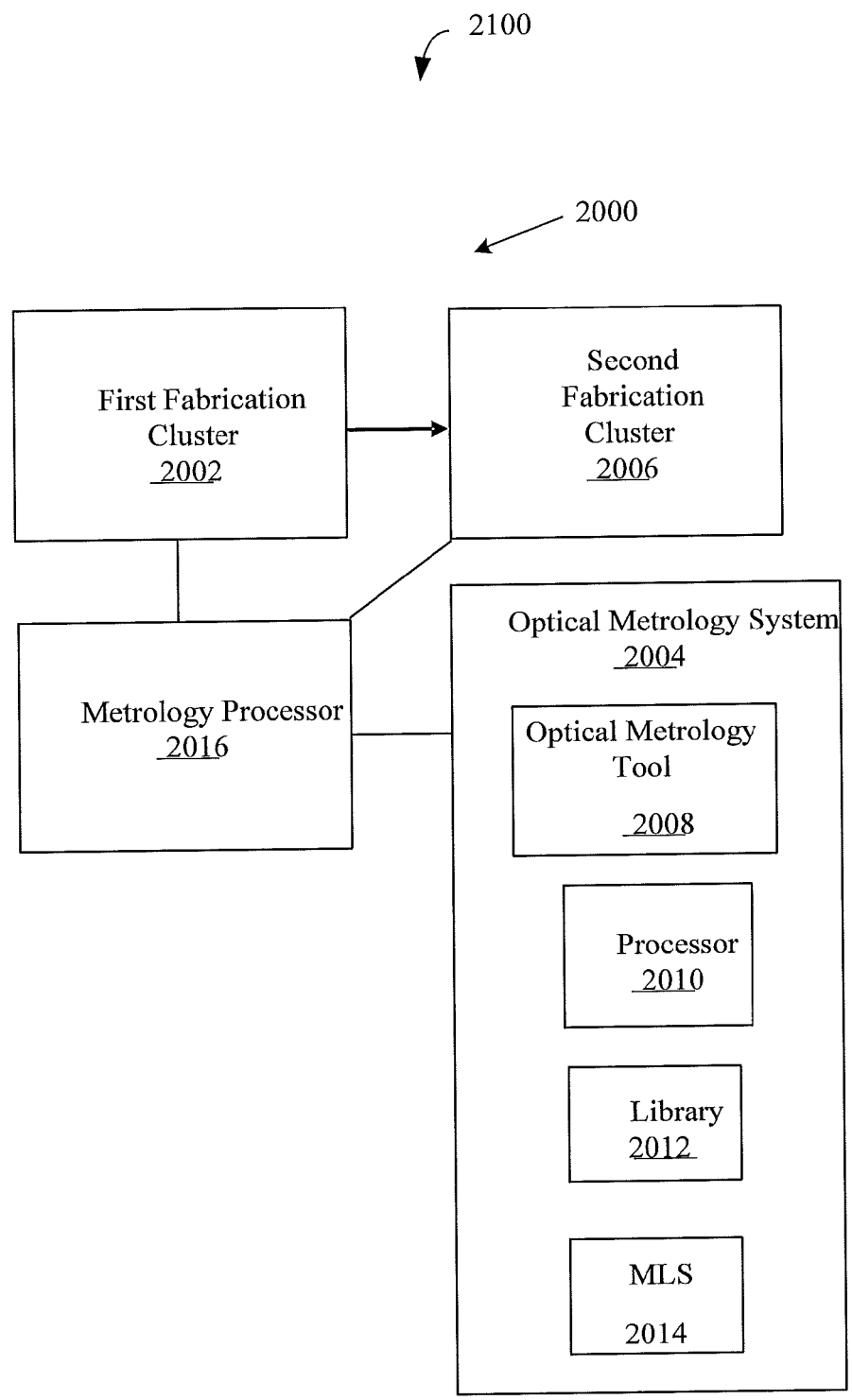
FIG. 16 is an exemplary block diagram of a system for determining and utilizing profile parameters for automated process and equipment control.

FIG. 16 is an exemplary block diagram 2100 of a system 2000 for determining and utilizing profile parameters for automated process and equipment control. System 2000 includes a first fabrication cluster 2002 and optical metrology system 2004. System 2000 also includes a second fabrication cluster 2006. Although the second fabrication cluster 2006 is depicted in FIG. 16 as being subsequent to first fabrication cluster 2002, it should be recognized that second fabrication cluster 2006 can be located prior to first fabrication cluster 2002 in system 2000, for example, in the manufacturing process flow.

A photolithographic process, such as exposing and/or developing a photoresist layer applied to a wafer, can be performed using first fabrication cluster 2002. Optical metrology system 2004 is similar to optical metrology system 40 of FIG. 1. In one exemplary embodiment, optical metrology system 2004 includes an optical metrology tool 2008 and processor 2010. Optical metrology tool 2008 is configured to measure a diffraction signal off the sample structure. Processor 2010 is configured to use the measured diffraction signal measured by the optical metrology tool and adjust using the signal adjuster (FIG. 13), generating an adjusted metrology output signal. Furthermore, processor 2010 is configured to compare the adjusted metrology output signal to the simulated diffraction signal. As mentioned above, the simulated diffraction is determined using an optical metrology tool model using ray tracing, a set of profile parameters of the structure and numerical analysis based on the Maxwell equations of electromagnetic diffraction. In one exemplary embodiment, optical metrology system 2004 can also include a library 2012 with a plurality of simulated diffraction signals and a plurality of values of one or more profile parameters associated with the plurality of simulated diffraction signals. As described above, the library can be generated in advance; metrology processor 2010 can compare an adjusted metrology output signal to the plurality of simulated diffraction signals in the library. When a matching simulated diffraction signal is found, the one or more values of the profile parameters associated with the matching simulated diffraction signal in the library is assumed to be the one or more values of the profile parameters used in the wafer application to fabricate the sample structure.

System 2000 also includes a metrology processor 2016. In one exemplary embodiment, processor 2010 can transmit the one or more values of the one or more profile parameters to metrology processor 2016. Metrology processor 2016 can then adjust one or more process parameters or equipment settings of the first fabrication cluster 2002 based on the one or more values of the one or more profile parameters determined using optical metrology system 2004. Metrology processor 2016 can also adjust one or more process parameters or equipment settings of the second fabrication cluster 2006 based on the one or more values of the one or more profile parameters determined using optical metrology system 2004. As noted above, second fabrication cluster 2006 can process the wafer before or after fabrication cluster 2002. In another exemplary embodiment, processor 2010 is configured to train machine learning system 2014 using the set of measured diffraction signals as inputs to machine learning system 2014 and profile parameters as the expected outputs of machine learning system 2014.

Although exemplary embodiments have been described, various modifications can be made without departing from the spirit and/or scope of the present invention. For example, although a focus detector array was primarily used to describe the embodiments of the invention; other position sensitive detectors may also be used. For automated process control, the fabrication clusters may be a track, etch, deposition, chemical-mechanical polishing, thermal, or cleaning fabrication cluster. Furthermore, the elements required for the auto focusing are substantially the same regardless of whether the optical metrology system is integrated in a fabrication cluster or used in a standalone metrology setup. Therefore, the present invention should not be construed as being limited to the specific forms shown in the drawings and described above.

What is claimed:

1. A method for determining profile parameters of a sample structure on a workpiece using an optical metrology system optimized to achieve one or more accuracy targets, the optical metrology system including an optical metrology tool, an optical metrology tool model, a profile model of the sample structure, and a parameter extraction algorithm, the profile model having profile parameters, the method comprising:
    setting one or more accuracy targets for profile parameter determination for the sample structure;
    selecting a number of rays and beam propagation parameters to be used to model the optical metrology tool, the optical metrology tool having a light source, an illumination beam, optical elements, a diffraction beam, and a detector;
    measuring a diffraction signal off the sample structure using the optical metrology tool, generating a metrology output signal;
    determining an adjusted metrology output signal using the metrology output signal and calibration data;
    optimizing the optical metrology tool model and the profile model using the adjusted metrology output signal and the parameter extraction algorithm;
    if the one or more accuracy targets are not met, adjusting the selected number of rays, the selected beam propagation parameters, and/or the profile parameters and iterating the determining the adjusted metrology output signal and optimizing the optical metrology tool model and the profile model using the adjusted metrology output signal and the parameter extraction algorithm until the one or more accuracy targets are met.

2. The method of claim 1 wherein the determining the adjusted metrology output signal further comprises:
    determining beam propagation parameters for each ray of the selected number of rays from the light source of the optical metrology tool to the sample structure;
    determining the beam propagation parameters for each ray of the selected number of rays from the sample structure to the detector;
    calculating intensity polarization of each ray of the diffraction beam on the detector;
    generating a total intensity and polarization of the diffraction beam by integrating over the cross section of the diffraction beam; and
    calculating an metrology output signal from the total intensity and polarization.

3. The method of claim 2 wherein the selected number of rays is one or two or more rays.

4. The method of claim 2 wherein the beam propagation parameters include one or more of angle of incidence, azimuth angle, plane of incidence, orientation of the ray, intensity, uniformity of intensity distribution across the cross section, polarization state, uniformity of polarization state change, thin film transmittance and reflection effect, light scattering effect, and/or stray light effect.

5. The method of claim 4 wherein the profile extraction algorithm includes use of a regression module, a library matching module, and/or a machine learning methods module.

6. The method of claim 4 wherein extracting the one or more profile parameters using the metrology output signal and the profile extraction algorithm further comprises:
    performing simulation calculations to generate a simulated diffraction signal using regression, library matching, and/or machine learning systems.

7. The method of claim 6 wherein the determining the adjusted metrology output signal takes into account the polarization state change for each ray can be different depending on the plane of entry of the ray through each optical element of the optical metrology tool.

8. The method of claim 6 wherein the determining the adjusted metrology output signal takes into account beam intensity distribution for each ray can be non-uniform over the cross section of the ray through each optical element and wherein the differences of beam intensity distribution are included in the diffraction signal simulation calculations.

9. The method of claim 6 wherein the determining the adjusted metrology output signal takes into account depolarization of the ray can be different across the ray cross section and wherein the differences of depolarization are included in the diffraction signal simulation calculations.

10. The method of claim 6 wherein the determining the adjusted metrology output signal takes into account depolarization of the ray can be caused by light scattering due to imperfections or defects of optical elements and wherein the differences of depolarization are included in the diffraction signal simulation calculations.

11. The method of claim 6 wherein the determining the adjusted metrology output signal takes into account calculation of polarization parameters is based on a wavelength of the ray after the ray is transmitted through two or more layers of materials with different indices of refraction.

12. The method of claim 6 wherein the determining the adjusted metrology output signal takes into account geometry parameters including reflection angle, azimuth angle, diffraction angle, and diffraction angle are calculated for each ray using an optical configuration specified for the optical metrology tool and geometric optics calculations.

13. The method of claim 6 wherein the determining the adjusted metrology output signal takes into account geometry parameters and polarization parameters are determined using obtained design parameters and obtained calibration parameters of the optical metrology tool.

14. The method of claim 6 wherein the determining the adjusted metrology output signal takes into account calibration parameters including strain birefringence, scattering, and/or stray light.

15. The method of claim 1 wherein the sample structure is a semiconductor grating or a repetitive structure on a wafer or substrate.

16. The method of claim 1 wherein the one or more accuracy targets include total measurement uncertainty, confidence interval, standard uncertainty, combined standard uncertainty, and/or expanded uncertainty.

17. The method of claim 1 wherein the one or more accuracy targets include total measurement uncertainty (TMU) wherein TMU is set to 0.50 or lower, 0.60 to 0.20, or 0.40 or lower.

18. The method of claim 1 wherein the one or more accuracy targets include total measurement uncertainty (TMU) and confidence interval (CI).

19. The method of claim 18 wherein TMU is set to 0.50 or lower and CI is set to 90% or higher.

\* \* \* \* \*